(12) United States Patent
Moriyama et al.

(10) Patent No.: US 11,252,362 B2
(45) Date of Patent: Feb. 15, 2022

(54) IMAGING ELEMENT, IMAGING DEVICE, AND IMAGING METHOD

(71) Applicant: SONY SEMICONDUCTOR SOLUTIONS CORPORATION, Kanagawa (JP)

(72) Inventors: Suguru Moriyama, Kanagawa (JP); Kosuke Ozaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,655

(22) PCT Filed: Aug. 1, 2019

(86) PCT No.: PCT/JP2019/030192
§ 371 (c)(1),
(2) Date: Feb. 16, 2021

(87) PCT Pub. No.: WO2020/044928
PCT Pub. Date: Mar. 5, 2020

(65) Prior Publication Data
US 2021/0306584 A1 Sep. 30, 2021

(30) Foreign Application Priority Data
Aug. 31, 2018 (JP) .............................. JP2018-163810

(51) Int. Cl.
*H04N 5/369* (2011.01)
*G02B 5/30* (2006.01)

(52) U.S. Cl.
CPC ....... *H04N 5/36961* (2018.08); *G02B 5/3025* (2013.01)

(58) Field of Classification Search
CPC ......... H04N 5/36961; H04N 5/232122; H04N 5/23212; H01L 27/14627; G02B 5/3025
See application file for complete search history.

(56) References Cited

U.S. PATENT DOCUMENTS

2011/0279727 A1* 11/2011 Kusaka ................ H04N 5/3696
348/340
2012/0319222 A1 12/2012 Ozawa et al.
(Continued)

FOREIGN PATENT DOCUMENTS

| CN | 102402106 A | 4/2012 |
|---|---|---|
| CN | 202454558 U | 9/2012 |

(Continued)

OTHER PUBLICATIONS

International Search Report and Written Opinion of PCT Application No. PCT/JP2019/030192, dated Sep. 8, 2019, 08 pages of ISRWO.

*Primary Examiner* — Nelson D. Hernández Hernández
(74) *Attorney, Agent, or Firm* — Chip Law Group

(57) ABSTRACT

A process of manufacturing an imaging element is simplified. The imaging element includes a polarization pixel and a phase difference pixel. The polarization pixel included in the imaging element includes a polarizer transmitting incident light having a specific polarization direction and generates an image signal based on the incident light being from a subject and being transmitted through the polarizer. The phase difference pixel included in the imaging element includes a light shielding film being formed simultaneously with the polarizer and being disposed to be shifted in a predetermined pupil-division direction for pupil-dividing the incident light from the subject and generates an image signal for detecting a phase difference.

13 Claims, 20 Drawing Sheets

(56) References Cited

U.S. PATENT DOCUMENTS

| | | | |
|---|---|---|---|
| 2015/0084146 A1 | | 3/2015 | Kusaka |
| 2016/0027823 A1 | | 1/2016 | Kusaka |
| 2016/0337575 A1 | * | 11/2016 | Akiyama .......... H01L 27/14627 |
| 2016/0380016 A1 | | 12/2016 | Kusaka |
| 2017/0278890 A1 | | 9/2017 | Kusaka |
| 2019/0140009 A1 | | 5/2019 | Kusaka |

FOREIGN PATENT DOCUMENTS

| | | |
|---|---|---|
| CN | 105355637 A | 2/2016 |
| EP | 2615640 A1 | 7/2013 |
| JP | 2011-176715 A | 9/2011 |
| JP | 2012-080065 A | 4/2012 |
| JP | 2015-144194 A | 8/2015 |
| KR | 10-2013-0101972 A | 9/2013 |
| TW | 201222008 A | 6/2012 |
| WO | 2012/032939 A1 | 3/2012 |
| WO | 2015/115204 A1 | 8/2015 |

* cited by examiner

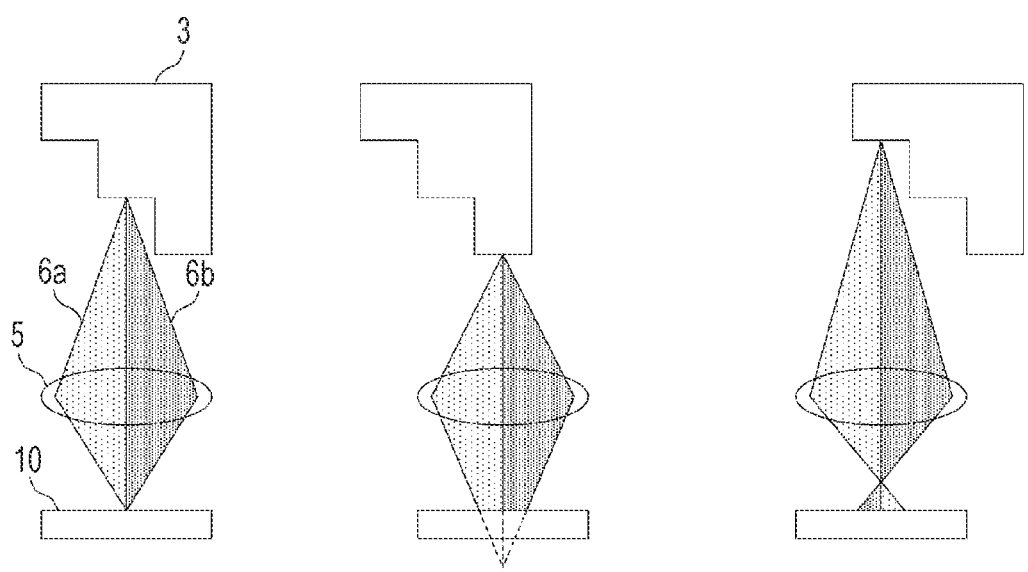
FIG. 10A  FIG. 10B  FIG. 10C
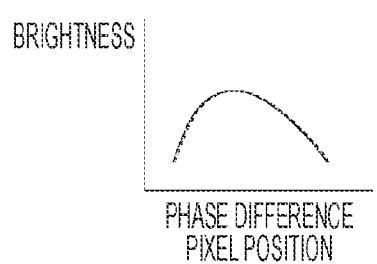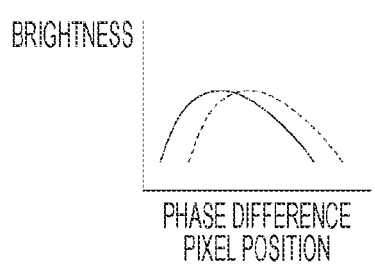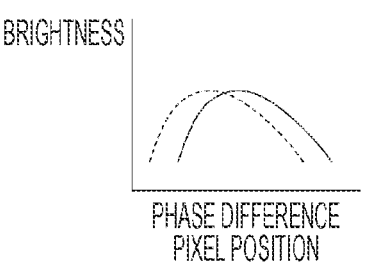
FIG. 10D  FIG. 10E  FIG. 10F

IMAGING ELEMENT, IMAGING DEVICE, AND IMAGING METHOD

CROSS REFERENCE TO RELATED APPLICATIONS

This application is a U.S. National Phase of International Patent Application No. PCT/JP2019/030192 filed on Aug. 1, 2019, which claims priority benefit of Japanese Patent Application No. JP 2018-163810 filed in the Japan Patent Office on Aug. 31, 2018. Each of the above-referenced applications is hereby incorporated herein by reference in its entirety.

TECHNICAL FIELD

The present disclosure relates to an imaging element, an imaging device, and an imaging method. More specifically, the present disclosure relates to an imaging element, an imaging device, and an imaging method for detecting a phase difference in a subject.

BACKGROUND ART

Conventionally, an imaging device for auto-focusing by detecting a phase difference in a captured image to detect the focal position of an imaging lens has been used. On an imaging element used for the imaging device, a phase difference pixel for detecting a phase difference through pupil division of the light from a subject is disposed. The phase difference pixel is light-shielded in a substantially half area of its light receiving surface by a light shielding film, whereby the pupil division is achieved. As an example of such an imaging element, a solid-state imaging element in which a polarization structure is disposed on a phase difference pixel has been proposed (see, for example, Patent Document 1). In the solid-state imaging element, the polarization structure is disposed in a layer above the light shielding film in a phase difference pixel. Here, the polarization structure refers to a plurality of metal wires arranged in parallel at predetermined intervals to allow the light having a specific polarization direction to be transmitted. Disposing the polarization structure can prevent the light diffracted or reflected inside the phase difference pixel from leaking out of the phase difference pixel. Note that a color filter instead of the polarization structure is disposed in a pixel other than the phase difference pixels.

CITATION LIST

Patent Document

Patent Document 1: Japanese Patent Application Laid-Open No. 2015-144194

SUMMARY OF THE INVENTION

Problems to be Solved by the Invention

The above-described conventional technology is problematic in that the process of manufacturing the imaging element is complicated because it is necessary to dispose the light shielding film in a phase difference pixel and, in addition, to form the polarization structure at a position corresponding to a color filter disposed in another pixel.

The present disclosure has been made in view of the above-described problems, and an object of the present disclosure is to simplify the process of manufacturing imaging elements.

Solutions to Problems

The present disclosure has been made in order to solve the above-mentioned problems, and a first aspect thereof is an imaging element including: a polarization pixel that includes a polarizer transmitting incident light having a specific polarization direction and generates an image signal based on the incident light being from a subject and being transmitted through the polarizer; and a phase difference pixel that includes a light shielding film being formed simultaneously with the polarizer and being disposed to be shifted in a predetermined pupil-division direction for pupil-dividing the incident light from the subject and generates an image signal for detecting a phase difference.

Furthermore, in the first aspect, the polarizer may include a wire grid that includes a plurality of strip-shaped conductors arranged at a predetermined pitch.

Furthermore, in the first aspect, the light shielding film may include the same material as the material of the polarizer.

Furthermore, in the first aspect, the phase difference pixel may further include the polarizer.

Furthermore, in the first aspect, the imaging element may include the polarization pixel that individually includes the polarizer having at least three polarization directions.

Furthermore, in the first aspect, the imaging element may further include a pixel that generates an image signal based on the incident light from the subject.

Furthermore, in the first aspect, the imaging element may include the polarization pixel that individually includes the polarizer having at least two polarization directions.

Furthermore, a second aspect of the present disclosure is an imaging device including: a polarization pixel, which is a pixel that includes a polarizer transmitting incident light that has a specific polarization direction, the incident light being from a subject; a phase difference pixel, which is a pixel that includes a light shielding film being formed simultaneously with the polarizer and being disposed to be shifted in a predetermined pupil-division direction for pupil-dividing the incident light; and a processing unit that processes an image signal generated by the polarization pixel and an imaging signal generated by the phase difference pixel.

Furthermore, in the second aspect, the processing unit may include: a polarization information generating unit that generates polarization information on the basis of an image signal generated by the polarization pixel, the polarization information being information regarding polarization in an image of the subject; and a phase difference information generating unit that generates, on the basis of an image signal generated by the phase difference pixel, phase difference information representing a phase difference in the subject.

Furthermore, in the second aspect, the processing unit may include: a normal line information generating unit that generates normal line information regarding an image of the subject, on the basis of the polarization information that has been generated; and a depth information generating unit that generates depth information regarding an image of the subject, on the basis of the phase difference information that has been generated.

Furthermore, in the second aspect, the processing unit may further include a normal vector generating unit that generates a normal vector in an image of the subject, on the basis of the normal line information that has been generated and the depth information that has been generated.

Furthermore, in the second aspect, the phase difference information generating unit may generate the phase difference information regarding an image selected on the basis of the polarization information that has been generated.

Furthermore, a third aspect of the present disclosure is an imaging method including: a polarization information generating step of generating, on the basis of an image signal generated by a polarization pixel that includes a polarizer transmitting incident light having a specific polarization direction and generates the image signal based on the incident light being from a subject and being transmitted through the polarizer, polarization information being information regarding polarization in an image of the subject; and a phase difference information generating step of generating, on the basis of an image signal generated by a phase difference pixel that includes a light shielding film being formed simultaneously with the polarizer and being disposed to be shifted in a predetermined pupil-division direction for pupil-dividing the incident light from the subject, phase difference information representing a phase difference in the subject.

These aspects provide the effect of simultaneously forming the polarizer of a polarization pixel and the light shielding film of a phase difference pixel.

BRIEF DESCRIPTION OF DRAWINGS

FIGS. 10A, 10B, 10C, 10D, 10E, and 10F are diagrams illustrating an example of phase difference information according to the first embodiment of the present disclosure.

MODE FOR CARRYING OUT THE INVENTION

Figure 1:
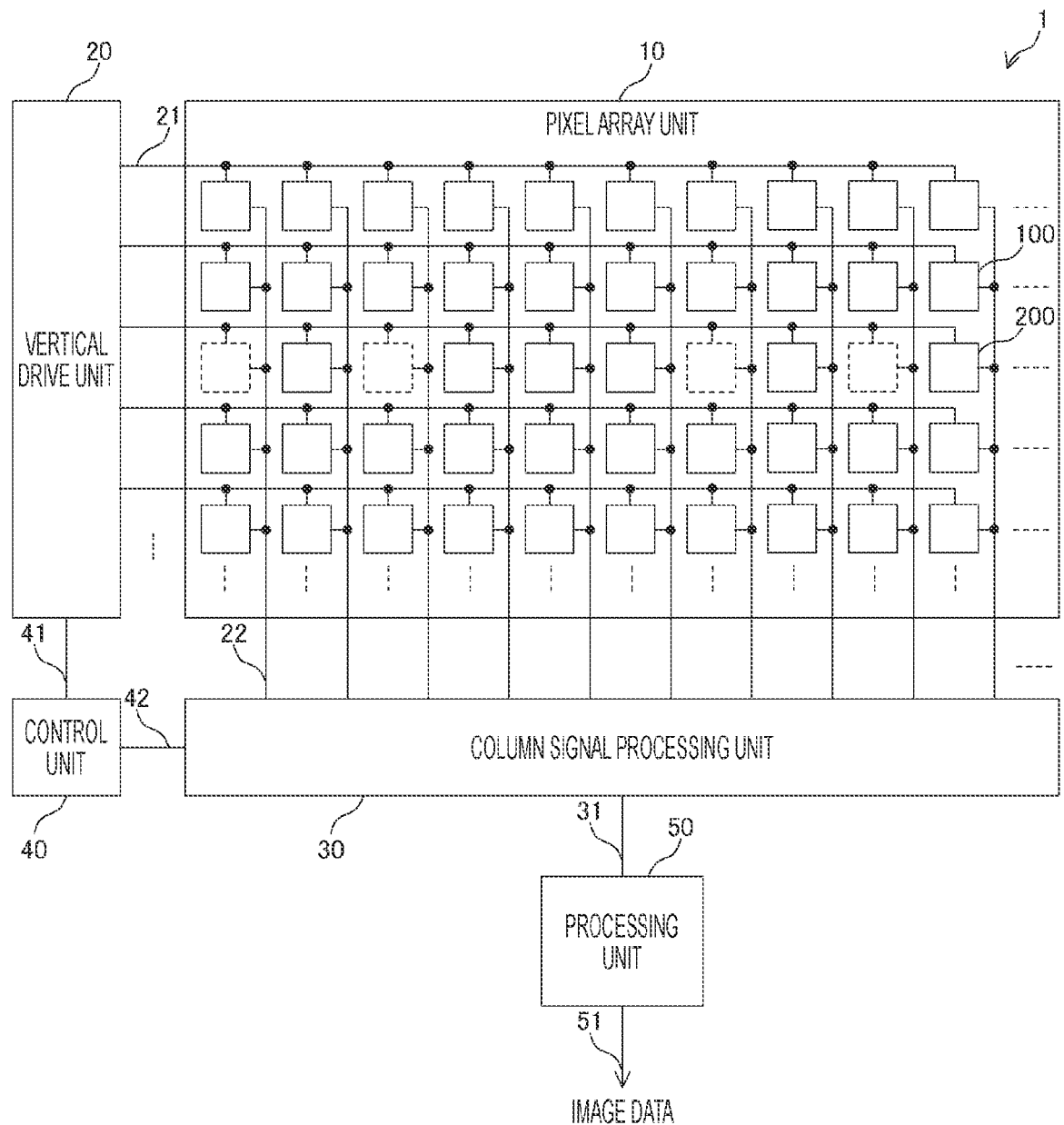
FIG. 1 is a diagram illustrating an example configuration of an imaging device according to an embodiment of the present disclosure.

A mode for carrying out the present disclosure (hereinafter referred to as an embodiment) will now be described with reference to the drawings. Throughout the drawings described below, identical or similar reference numerals are given to identical or similar portions. However, the drawings are schematically shown, and thus the dimensional ratios or the like of the individual portions thereon do not always represent the actual ones. Furthermore, as a matter of course, dimensional relationships and ratios may be inconsistent in some parts between drawings. In addition, descriptions of embodiments will be given in the order mentioned below.

1. First Embodiment
2. Second Embodiment
3. Third Embodiment
4. Fourth Embodiment
5. Example of application to camera 1. First Embodiment

[Configuration of Imaging Device]

FIG. 1 is a diagram illustrating an example configuration of an imaging device according to an embodiment of the present disclosure. An imaging device 1 in the figure includes a pixel array unit 10, a vertical drive unit 20, a column signal processing unit 30, a control unit 40, and a processing unit 50.

The pixel array unit 10 is structured by arranging pixels in a two-dimensional lattice. Here, the pixel refers to the one that generates an image signal in accordance with the light incident thereon. Two pixels, a polarization pixel 100 and a phase difference pixel 200, are disposed in the pixel array unit 10 in the figure. These pixels each include a photoelectric conversion unit that generates an electric charge in accordance with the light incident thereon. In addition, the pixel further includes a pixel circuit. The pixel circuit generates an image signal based on the electric charge generated by the photoelectric conversion unit. Generation of the image signal is controlled by a control signal generated by the vertical drive unit 20 described later. In the pixel array unit 10, signal lines 21 and 22 are arranged in an XY matrix. The signal line 21, which is a signal line for transmitting a control signal for the pixel circuit in the polarization pixel, is disposed on each row in the pixel array unit 10 and is wired commonly to the pixels disposed on each row. The signal line 22, which is a signal line for transmitting an image signal generated by the pixel circuit in a pixel, is disposed on each column in the pixel array unit 10 and is wired commonly to the pixels disposed on each column. These photoelectric conversion units and pixel circuits are formed on a semiconductor substrate.

The polarization pixel 100 is a pixel in which a polarizer is disposed. Here, the polarizer refers to the one that transmits the incident light having a specific polarization direction. The polarization pixel 100 generates an image signal based on the incident light that is from a subject and transmitted through the polarizer. The configuration of the polarization pixel 100 will be described later in detail.

The phase difference pixel 200 is a pixel that generates an image signal for detecting a phase difference by pupil-dividing the incident light from the subject. The phase difference pixel 200 detects, as a phase difference, a deviation of an image caused by the light passing through different regions in the imaging lens that forms an image of the light from the subject on the pixel array unit 10. The phase difference pixel 200 is a pixel used for autofocusing, for example. As illustrated in the figure, a plurality of phase difference pixels 200 is disposed on a specific row in the pixel array unit 10. In addition, the pupil division is a method for dividing the light transmitted through the imaging lens into two rays of light. In the pixel array unit 10 in the figure, the light transmitted through the imaging lenses in a direction of a row along which the phase difference pixels 200 are disposed is divided. The configuration of the phase difference pixel 200 will be described later in detail. Note that the pixel array unit 10 is an example of the imaging element described in the claims.

The vertical drive unit 20 generates control signals for the pixel circuits in the polarization pixels 100 and the phase difference pixels 200. The vertical drive unit 20 transmits the generated control signals to the polarization pixels 100 and the phase difference pixels 200 via the signal line 21 in the figure. The column signal processing unit 30 processes image signals generated by the polarization pixels 100 and the phase difference pixels 200. The column signal processing unit 30 processes the image signals transmitted from the polarization pixels 100 and the phase difference pixels 200 via the signal line 22 in the figure. The processing in the column signal processing unit 30 includes, for example, analog-to-digital conversion by which analog image signals generated in the polarization pixels 100 and the phase difference pixels 200 are converted into digital image signals. An image signal resulting from the processing in the column signal processing unit 30 is output to the processing unit 50.

The control unit 40 controls the vertical drive unit 20 and the column signal processing unit 30. The control unit 40 controls the pixel array unit 10 by generating and outputting control signals for controlling the vertical drive unit 20 and the column signal processing unit 30. Control signals generated by the control unit 40 are transmitted to the vertical drive unit 20 and the column signal processing unit 30 via the signal lines 41 and 42, respectively.

The processing unit 50 processes image signals generated by the polarization pixels 100 and image signals generated by the phase difference pixels 200. Specifically, the processing unit 50 processes digital image signals into which signals are converted by the column signal processing unit 30. The configuration of the processing unit 50 will be described later in detail. Note that the vertical drive unit 20, the column signal processing unit 30, the control unit 40, the processing unit 50, and the pixel array unit 10 may be formed on the same semiconductor substrate. Alternatively, the vertical drive unit 20 and others may be formed on a semiconductor substrate different from the semiconductor substrate on which the pixel array unit 10 is formed.

[Configuration of Imaging Element]

Figure 2:
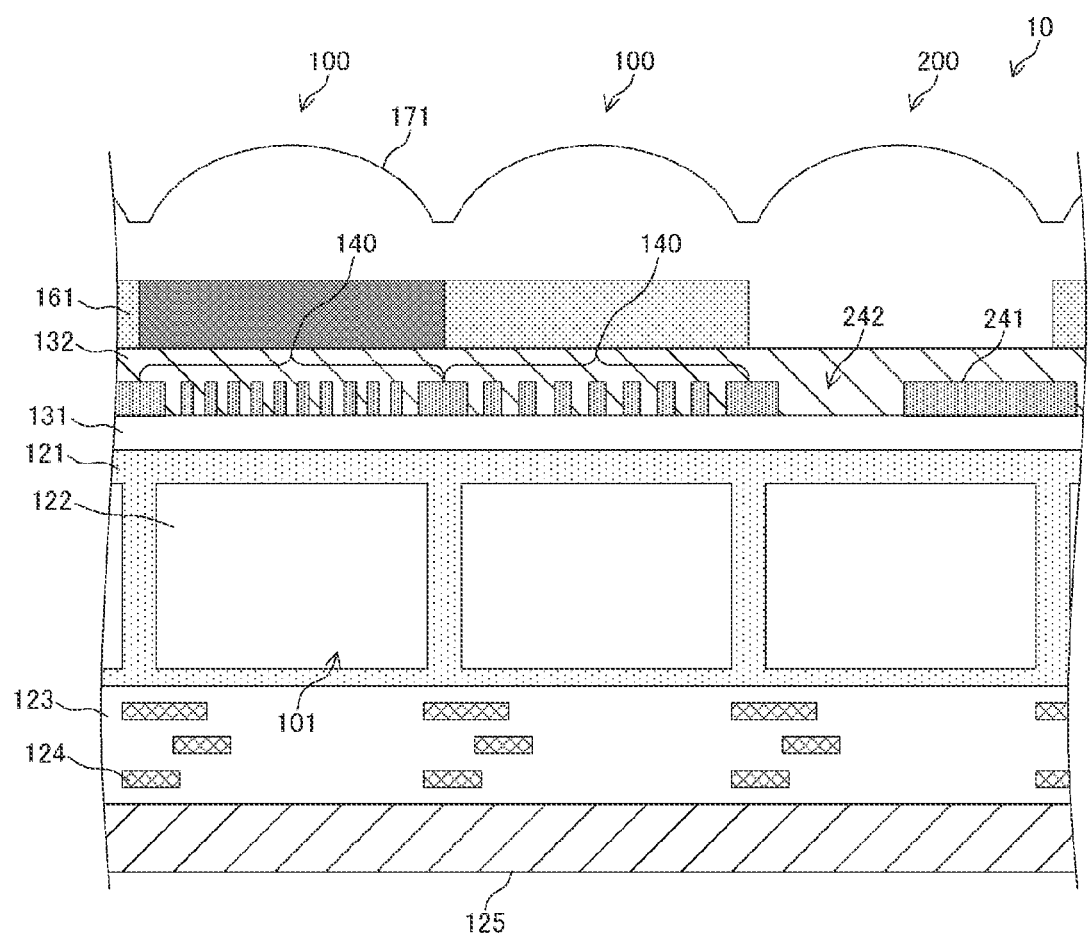
FIG. 2 is a diagram illustrating an example configuration of an imaging element according to a first embodiment of the present disclosure.

FIG. 2 is a diagram illustrating an example configuration of the imaging element according to the first embodiment of the present disclosure. The figure is a cross-section diagram, which shows an example configuration of the pixel array unit 10, illustrating an example configuration of the polarization pixel 100 and the phase difference pixel 200 described with reference to FIG. 1. The pixel array unit 10 includes a semiconductor substrate 121, an insulating layer 123, a wiring layer 124, a support substrate 125, insulating films 131 and 132, a polarizer 140, a light shielding film 241, a color filter 161, and an on-chip lens 171.

The semiconductor substrate 121 is a semiconductor substrate in which a semiconductor portion of an element in the photoelectric conversion unit, the pixel circuit, and the like of each of the polarization pixels 100 and the phase difference pixels 200 is formed. The photoelectric conversion unit 101 among others is shown in the figure. For example, a p-type well region is formed in the semiconductor substrate 121, and the semiconductor portion of the above-described element is formed in the well region. For convenience, it is assumed that a well region is formed in the semiconductor substrate 121 in the figure. The photoelectric conversion unit 101 in the figure includes an n-type semiconductor region 122 formed in the well region and a p-type well region around the n-type semiconductor region 122. A photodiode is formed by a pn junction between the n-type semiconductor region 122 and the p-type well region. The photodiode, which corresponds to the photoelectric conversion unit 101, generates an electric charge through photoelectric conversion when irradiated with incident light. The electric charge generated by the photoelectric conversion unit 101 is converted into an image signal by the pixel circuit (not illustrated).

The wiring layer 124 is the wiring that transmits image signals generated by the polarization pixels 100 and the phase difference pixels 200 and control signals for the polarization pixels 100 and the phase difference pixels 200. The wiring layer 124 may include a metal such as copper (Cu). The signal lines 21 and 22 described with reference to FIG. 1 include the wiring layer 124. The insulating layer 123 insulates the wiring layer 124. The insulating layer may include, for example, silicon oxide ($SiO_2$) or silicon nitride (SiN). Note that the insulating layer 123 and the wiring layer 124 are included in a wiring region. The wiring region is formed on the front surface side of the semiconductor substrate 121.

The support substrate 125 is a substrate supporting the pixel array unit 10. The support substrate 125, which is attached on the surface of the insulating layer 123, is disposed to improve the strength of the pixel array unit 10 subjected to the manufacturing process.

The insulating film 131 is a film that insulates the semiconductor substrate 121. The insulating film 131 includes, for example, SiO₂ to insulate the back surface side of the semiconductor substrate 121. The polarizer 140 and the light shielding film 241, which will be described later, are formed on the surface of the insulating film 131.

The insulating film 132 is a film that insulates the polarizer 140 and the light shielding film 241. Furthermore, the insulating film 132 is flattened on its surface on which the color filter 160 is to be formed. The insulating film 132 may include, for example, SiO₂.

The color filter 161, which is disposed in the polarization pixel 100, transmits the incident light that has a predetermined wavelength. In other words, the color filter 161 is an optical filter that selects the incident light to be transmitted in accordance with the wavelength. As the color filter 160, for example, three types of color filters 161 that transmit red light (wavelength 700 nm), green light (wavelength 546 nm), and blue light (436 nm) can be used. The on-chip lens 171 is a lens that condenses incident light. The on-chip lens 171 in the figure condenses the incident light onto the photoelectric conversion unit 101 via the color filter 161, the polarizer 140, and the like. Note that the pixel array unit 10 in the figure represents a backside illuminated imaging element, in which the back surface opposite to the surface where the wiring region of the semiconductor substrate 121 is formed is irradiated with the incident light.

The polarizer 140 polarizes incident light. The polarizer 140 polarizes the incident light by transmitting the incident light that has a specific polarization direction. In general, the light from a subject includes a plurality of light rays polarized in different directions. By imaging the light in a specific polarization direction among these light rays to generate an image signal, the quantity of the light in the polarization direction can be acquired. Repeating the operation with respect to each of a plurality of polarization directions makes it possible to obtain the polarization information indicating, for example, how the light rays from the subject are polarized. On the basis of the polarization information, a three-dimensional shape and the like of the subject can be understood.

The polarizer 140 may include, for example, a wire grid. Here, the wire grid refers to a polarizer formed by arranging a plurality of strip-shaped conductors at a predetermined pitch. Here, the strip-shaped conductor refers to a conductor formed into a line shape, a rectangular solid shape, or the like. When light is incident on the polarizer 140 that includes such conductors, free electrons in the conductors vibrate in accordance with the incident light. At that time, the incident light on the polarizer 140 polarized in a direction perpendicular to a direction along which the plurality of strip-shaped conductors is arranged, that is, the light polarized in a direction parallel to the longitudinal direction of the strip-shaped conductors, causes free electrons to vibrate along the longitudinal direction of the strip-shaped conductors. Therefore, the incident light perpendicular to the direction along which the plurality of strip-shaped conductors is arranged is canceled out by the light generated by the vibration of free electrons, failing to be transmitted through the polarizer 140 and is reflected from the polarizer 140. On the other hand, the incident light polarized in a direction parallel to the direction along which the plurality of strip-shaped conductors is arranged in the polarizer 140, that is, the incident light polarized in a direction perpendicular to the longitudinal direction of the strip-shaped conductors, causes free electrons to vibrate along the lateral direction of the strip-shaped conductors. In this case, since the intensity of the light generated by the vibration of free electrons is lower, the incident light having that polarization direction is allowed to be transmitted through the polarizer 140 because the attenuation caused by the polarizer 140 is smaller. The configuration of the polarizer 140 will be described later in detail.

The light shielding film 241 is disposed in the phase difference pixel 200 to shield the light receiving surface, which is the surface to be irradiated with the incident light on the phase difference pixel 200. Furthermore, the light shielding film 241 can be formed simultaneously with the polarizer 140. As illustrated in the figure, the light shielding film 241 can be disposed in the same layer as the layer of the polarizer 140 and can include the same material as the material of the polarizer 140. In the phase difference pixel 200, an opening 242 is formed in a region that is not shielded by the light shielding film 241. The photoelectric conversion unit 101 in the phase difference pixel 200 is irradiated with the incident light through the opening 242. In the phase difference pixel 200 in the figure, the light shielding film 241 is disposed to be shifted to the right side of the figure, and the opening 242 is disposed to be shifted to the left side in the figure. As described later, another phase difference pixel 200 in which the light shielding film 241 and the opening 242 in the figure are replaced with each other side to side is placed near the phase difference pixel 200, whereby these two phase difference pixels 200 achieve the pupil division in a side-to-side direction.

Note that the configuration of the pixel array unit 10 is not limited to this example. For example, the embodiment may be applied to a front-side illuminated imaging element, in which the front surface where the wiring region of the semiconductor substrate 121 is formed is irradiated with the incident light. Furthermore, the color filter 161 may also be disposed in the phase difference pixel 200 in another configuration. Alternatively, in still another configuration, the color filter 161 may be omitted to generate monochrome image signals. Furthermore, in still another configuration, an in-layer lens may be disposed in the insulating film 131 or 132.

[Arrangement in Imaging Element]

Figure 3A:
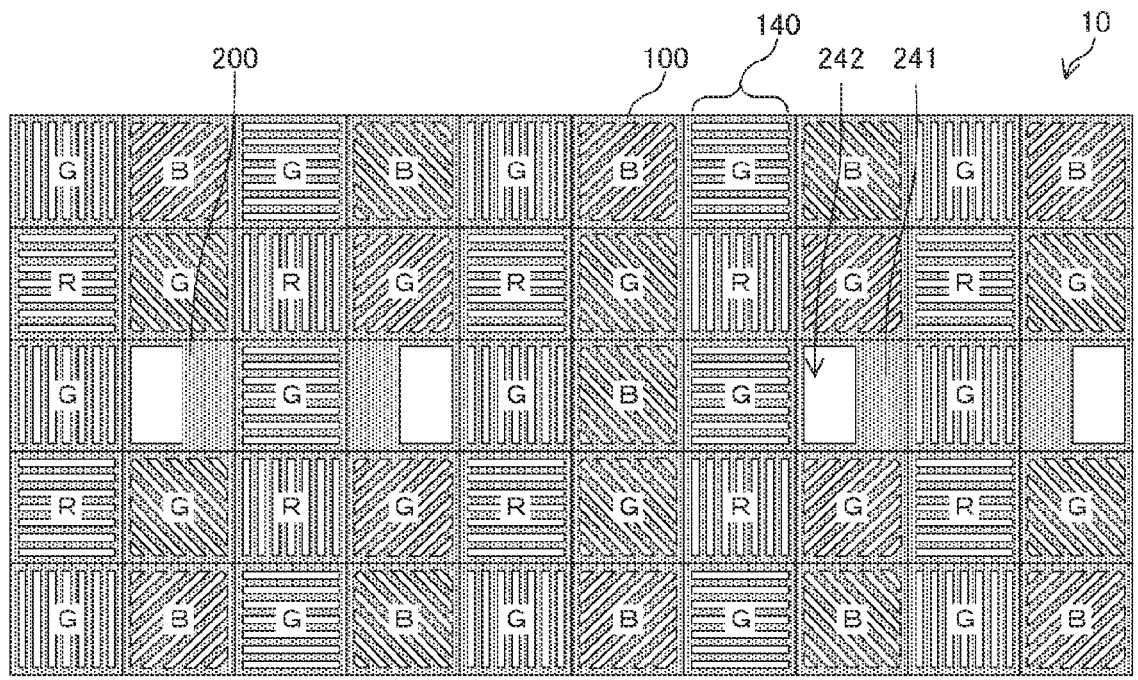
FIGS. 3A and 3B are diagrams illustrating an example arrangement of polarization pixels and phase difference pixels according to the first embodiment of the present disclosure.
Figure 3B:
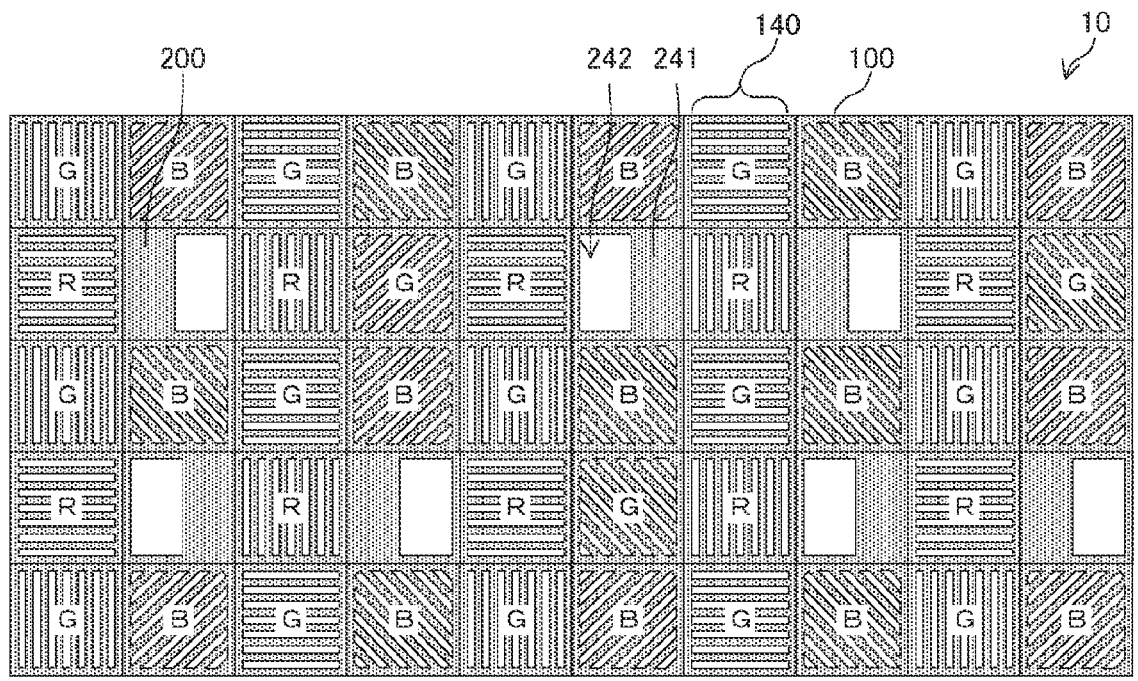

FIGS. 3A and 3B are diagrams illustrating an example arrangement of polarization pixels and phase difference pixels according to the first embodiment of the present disclosure. The figure shows an example arrangement of the polarization pixels 100 and the phase difference pixels 200. The polarizer 140 is placed at the position of the polarization pixel 100. As illustrated in the figure, the polarizer 140 includes a plurality of strip-shaped conductors arranged at a predetermined pitch. On the other hand, the light shielding film 241 and the opening 242 are disposed at the position of the phase difference pixel 200. In addition, the letters in the figure each represent the type of the color filter 161 disposed in the polarization pixel 100. "R", "G", and "B" represent the color filters 161 corresponding to red light, green light, and blue light, respectively.

The figure shows an example in which the polarization pixels 100 including the polarizers 140 having four different polarization directions are arranged. Specifically, the polarizers 140 having polarization directions different by 45 degrees are individually disposed in the corresponding polarization pixels 100. Furthermore, the color filters 161 in the polarization pixels 100 are arranged in a Bayer array. Here, the Bayer array refers to an arrangement method by which the color filters 161 corresponding to green light are arranged in a checkered pattern, and the color filters 161 corresponding to red light and the color filters corresponding to blue light are each disposed therebetween. Furthermore, the phase difference pixels 200 are arranged in pairs in which one phase difference pixel 200 has the opening 242 disposed on the left side and the other phase difference pixel 200 has the opening 242 disposed on the right side.

The ratio between the polarization pixels 100 and the phase difference pixels 200 may be changed in accordance with the purpose. The example in a of the figure shows that a larger number of the polarization pixels 100 are disposed than the phase difference pixels 200. In this case, a larger amount of polarization information can be obtained because a larger number of the polarization pixels 100 are disposed. On the other hand, the example in b of the figure shows that a relatively large number of the phase difference pixels 200 are disposed. In this case, a larger amount of phase difference information can be obtained.

Note that the configuration of the polarization pixel 100 is not limited to this example. For example, the color filters 161 corresponding to complementary colors (cyan, magenta, and yellow) may be used instead of the color filters 161 of the primary colors corresponding to red light, green light, and blue light. In addition, the polarization pixels 100 may be arranged in a Bayer array in units of four polarization pixels 100 arranged in two rows by two columns with the color filters 161 of the same color disposed therein.

[Configuration of Polarizer]

Figure 4:
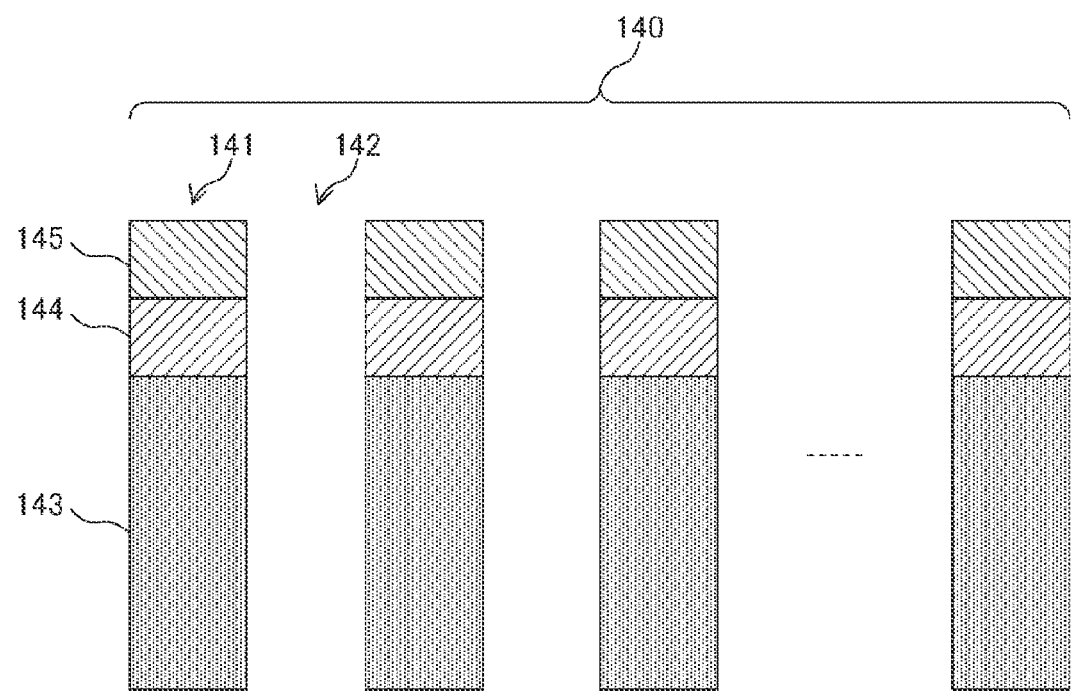
FIG. 4 is a diagram illustrating an example configuration of a polarizer according to an embodiment of the present disclosure.

FIG. 4 is a diagram illustrating an example configuration of the polarizer according to an embodiment of the present disclosure. The figure is a cross-sectional diagram illustrating an example configuration of the polarizer 140. The polarizer 140 in the figure includes a light reflecting layer 143, an insulating layer 144, and a light absorbing layer 145.

The light reflecting layer 143, which corresponds to the strip-shaped conductor described above, reflects incident light. The light reflecting layer 143 may include a conductive inorganic material. For example, a metal material such as aluminum (Al), silver (Ag), gold (Au), Cu, platinum (Pt), molybdenum (Mo), chromium (Cr), titanium (Ti), nickel (Ni), W, iron (Fe), and tellurium (Te) may be included. Alternatively, for example, an alloy containing these metals and a semiconductor material such as silicon (Si) and germanium (Ge) may be included.

The light absorbing layer 145 absorbs incident light. The light absorbing layer 145 may include a material similar to the material of the light reflecting layer 143; however, it is preferable to use a material having a high absorption coefficient in incident light.

The insulating layer 144 is an insulator that includes, for example, $SiO_2$. The insulating layer 144, which is disposed between the light reflecting layer 143 and the light absorbing layer 145, adjusts the phase of the light reflected from the light reflecting layer 143. Specifically, the insulating layer 144 adjusts the light reflected from the light reflecting layer 143 to a have a phase opposite to the phase of the light reflected from the light absorbing layer 145. Since the light having the phase adjusted by the insulating layer 144 and the light reflected from the light absorbing layer 145 are opposite in phase, both are attenuated by interference. Therefore, light reflection by the polarizer 140 can be reduced. Additionally, the insulating layer 144 serves as a base of the light absorbing layer 145.

The light reflecting layers 143, the insulating layers 144, and the light absorbing layers 145, which are stacked in succession, are arranged at a predetermined pitch. The light reflecting layer 143, the insulating layer 144, and the light absorbing layer 145 stacked together are hereinafter referred to as a light shielding line 141. A gap 142 is disposed between adjacent light shielding lines 141. The gap 142 is filled with the insulating film 132 described with reference to FIG. 2. Note that the configuration of the polarizer 140 is not limited to this example. For example, the light shielding line 141 in which the insulating layer 144 and the light reflecting layer 145 are omitted may be used. Furthermore, for example, it is possible to fill the gap 142 with a gas such as air.

[Method for Manufacturing Imaging Element]

FIGS. 5A, 5B, 5C, 6A, and 6B are diagrams illustrating an example method for manufacturing the imaging element according to the first embodiment of the present disclosure. The figures illustrate a method for manufacturing the polarizer 140 and the light shielding film 241 in the pixel array unit 10. First, a wiring region is formed in the semiconductor region 121 in which the well region, the n-type semiconductor region 122, and the like are formed. Next, the support substrate 125 is adhered thereto and is turned upside down. Then, the insulating film 131 is formed thereon, and the metal film 133 (not illustrated in FIG. 2) to serve as the base of the polarizer 140 is disposed (a of FIG. 6A). As the metal film 133, for example, a film in which Ti and titanium nitride (TiN) are stacked may be used.

Figure 5A:
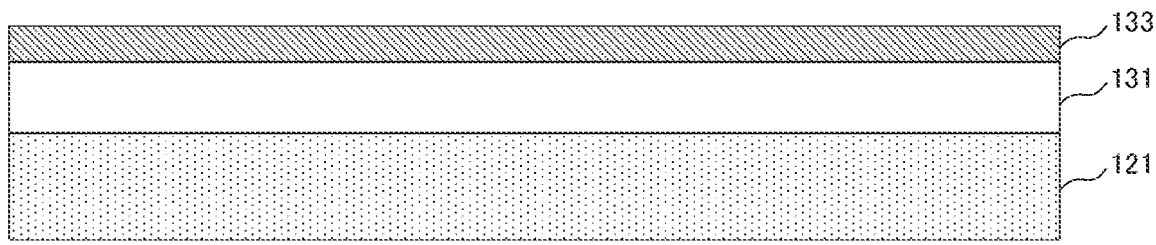
FIGS. 5A, 5B, and 5C are diagrams illustrating an example method for manufacturing the imaging element according to the first embodiment of the present disclosure.
Figure 5B:
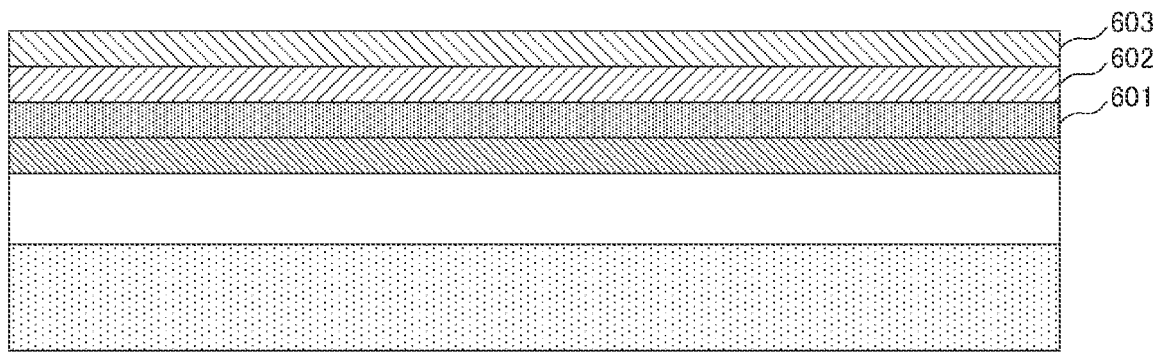

Next, a metal film 601, an insulator film 602, and a metal film 603, which are the materials of the light reflecting layer 145, the insulating layer 144, and the light absorbing layer 145, are stacked (FIG. 5B). The metal film 601, the insulator film 604, and the metal film 603 may employ films that include Al, SiO2, and W, respectively, and can be formed by chemical vapor deposition (CVD), sputtering, or the like.

Figure 5C:
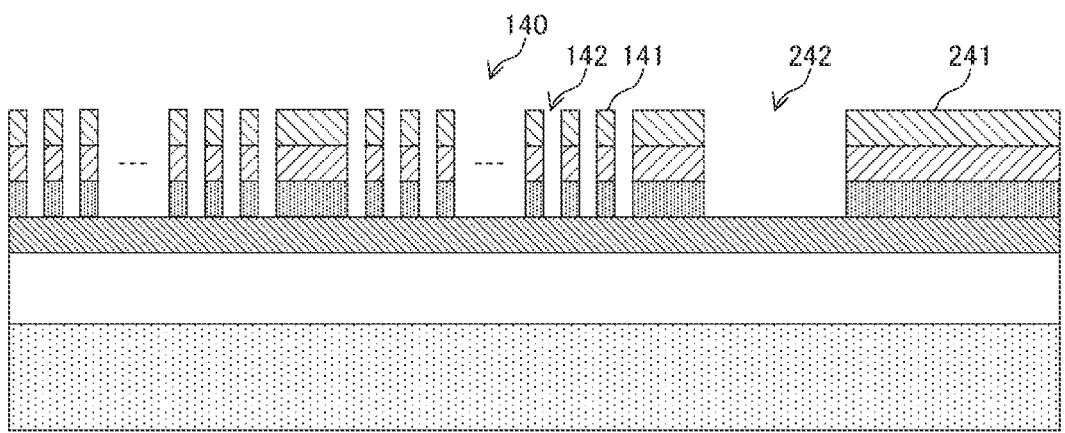
Figure 6A:
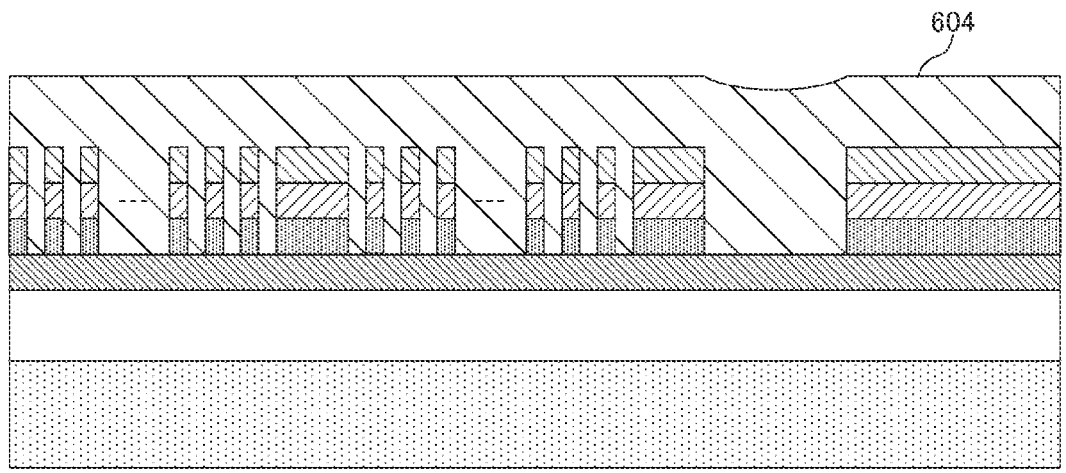
FIGS. 6A and 6B are diagrams illustrating an example method for manufacturing the imaging element according to the first embodiment of the present disclosure.
Figure 6B:
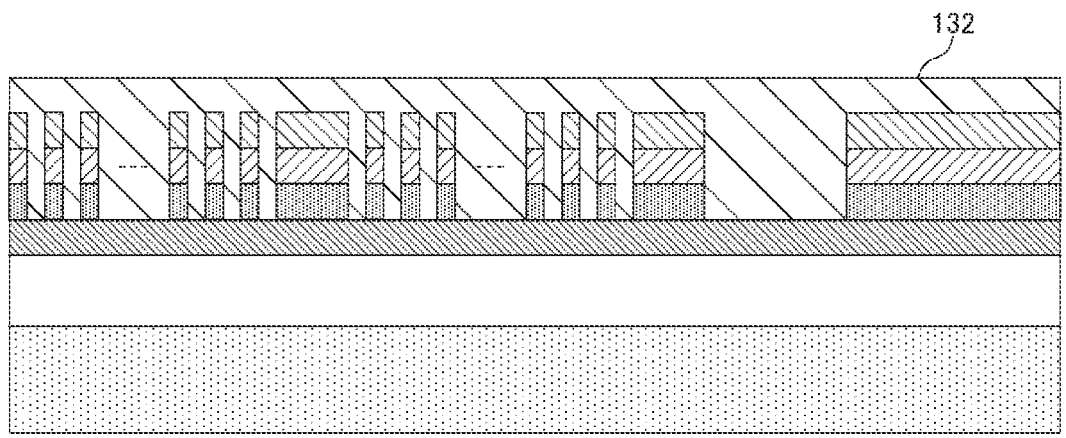

Next, the metal film 601, the insulator film 604, and the metal film 603 are etched to be formed into the light shielding line 141, the gap 142, the light shielding film 241, and the opening 242 (FIG. 5C). A known method may be used for the etching. Therefore, the polarizer 140 and the light shielding film 241 can be formed simultaneously.

Next, an insulator film 604, which is the material of the insulating film 132, is stacked thereon (FIG. 6D). The insulator film 604 may include, for example, an oxide or nitride such as SiO2, SiN, and silicon oxynitride (SiON). In addition, the insulator film 604 can be formed by, for example, high-density plasma CVD or atomic layer deposition (ALD).

Then, the insulating film 132 is formed by grinding the insulator film 604 to flatten its surface (FIG. 6E). The insulator film 604 can be ground by, for example, chemical mechanical polishing (CMP).

After that, the color filter 161 and the on-chip lens 171 are formed, whereby the pixel array unit 10 can be manufactured.

[Configuration of Processing Unit]

Figure 7:
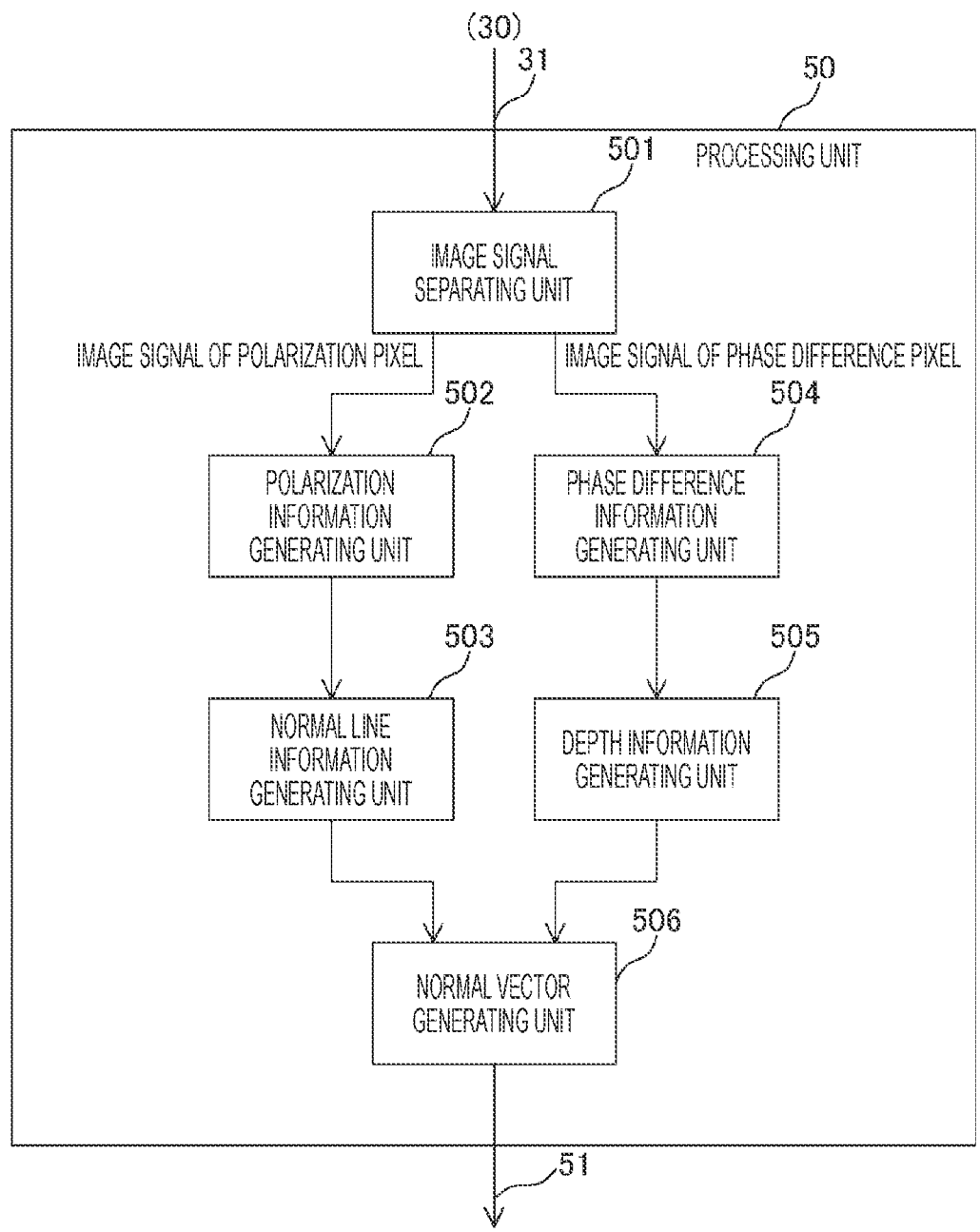
FIG. 7 is a diagram illustrating an example configuration of a processing unit according to the first embodiment of the present disclosure.

FIG. 7 is a diagram illustrating an example configuration of the processing unit according to the first embodiment of the present disclosure. The figure is a block diagram illustrating an example configuration of the processing unit 50 described with reference to FIG. 1. The processing unit 50 in the figure includes an image signal separating unit 501, a polarization information generating unit 502, a normal line information generating unit 503, a phase difference information generating unit 504, a depth information generating unit 505, and a normal vector generating unit 506.

The image signal separating unit 501 separates image signals generated by the polarization pixels 100 and the phase difference pixels 200. The image signal separating unit 501 separates digital image signals output from the column signal processing unit 30 into image signals of the polarization pixels and image signals of the phase difference pixels, and outputs the resulting image signals to the polarization information generating unit 502 and the phase difference information generating unit 504, respectively.

The polarization information generating unit 502 generates polarization information from image signals of the polarization pixels. Here, the polarization information refers to information regarding polarized light in an image of a subject. The polarization information generating unit 502 generates the polarization information on the basis of image signals corresponding to the incident light rays that have been transmitted through the polarizers 140 having four polarization directions as described with reference to FIGS. 3A and 3B.

The light from the subject includes a polarized component polarized in a specific direction and a non-polarized component not polarized in any specific polarization direction. The component polarized in a specific direction is the light based on specular reflection and is polarized depending on the orientation of a face of the subject when the light is reflected. On the other hand, the non-polarized component is the light based on diffuse reflection. The polarization information generating unit 502 separates an image signal of the polarization pixel into a polarized component and a non-polarized component. Then, the polarization information generating unit 502 generates polarization information representing the polarization direction (polarization angle) and the polarization degree of the polarized component. Processing in the polarization information generating unit 502 will be described later in detail.

The normal line information generating unit 503 generates normal line information on the basis of the polarization information generated by the polarization information generating unit 502. Here, the normal line information refers to the information that pertains to a normal line virtually formed on a face of the subject and identifies the orientation of the face of the subject. To the normal line information, angle information with respect to the x-axis and z-axis in the polar coordinate system can be applied. Processing in the normal line information generating unit 503 will be described later in detail.

The phase difference information generating unit 504 generates phase difference information from an image signal of the phase difference pixel. Here, the phase difference information refers to the information indicating a phase difference in the subject as described with reference to FIG. 1. On the imaging element (pixel array unit 10), an imaging lens is disposed at a predetermined focal length to form an image of the subject. By adjusting the position of the imaging lens so that the subject is in focus to form an image, it is made possible to obtain a less blurred image. As the phase difference pixel 200 is disposed, a phase difference, which represents a deviation of the subject from the focal position, can be detected. Furthermore, detecting a phase difference makes it possible to determine that the subject is located closer to the imaging element and the subject is located further from the imaging element with reference to the focal position. The phase difference information will be described later in detail.

The depth information generating unit 505 generates depth information regarding the subject on the basis of the phase difference information generated by the phase difference information generating unit 504. Here, the depth information refers to the information regarding the shape of the subject around the optical axis direction with reference to the focal position of the imaging lens. The depth information can be generated on the basis of the result of the above-mentioned determination made about the position of the subject.

The normal vector generating unit 506 generates the above-mentioned normal vector on the basis of the normal line information generated by the normal line information generating unit 503 and the depth information generated by the depth information generating unit 505.

[Normal Line Information]

Figure 8A:
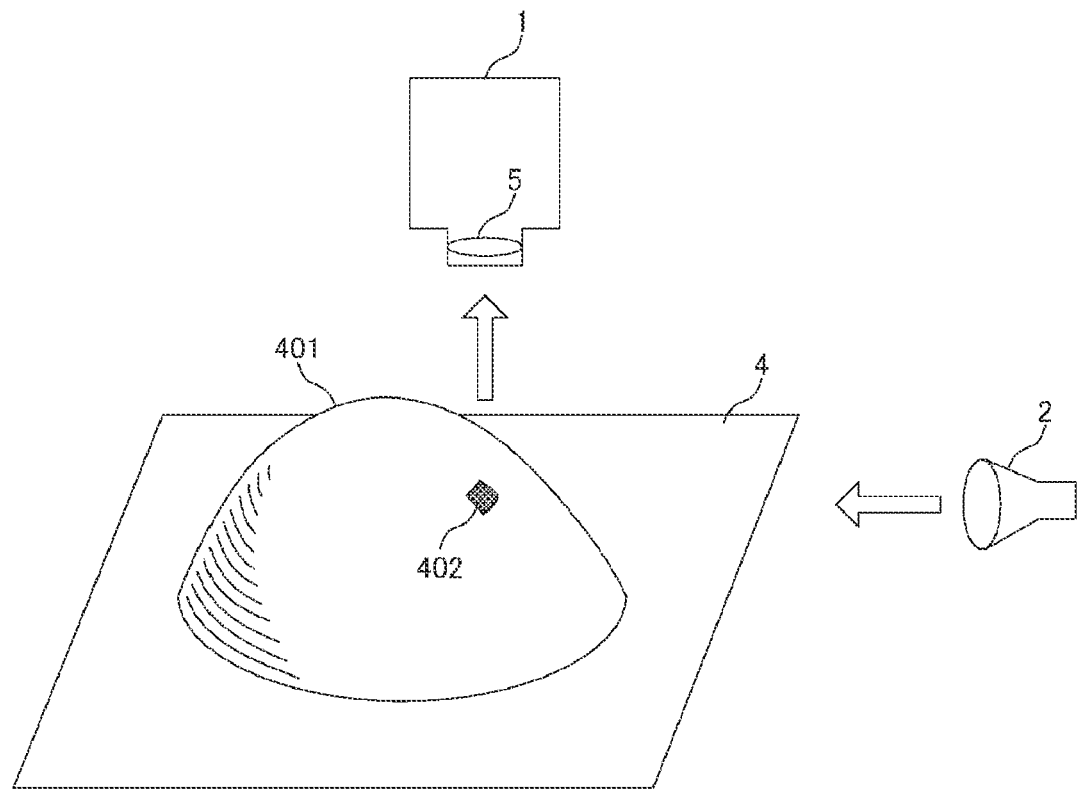
FIGS. 8A and 8B are diagrams illustrating an example of detection of a normal line according to the first embodiment of the present disclosure.
Figure 8B:
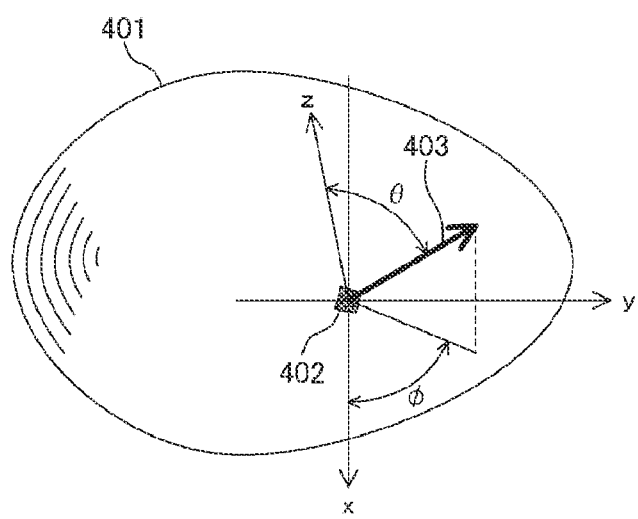

FIGS. 8A and 8B are diagrams illustrating an example of detection of a normal line according to the first embodiment of the present disclosure. In the figure, a is a diagram showing that the shape of the subject is acquired by detecting normal lines to the subject while capturing an image of the subject. In a of the figure, a subject 401 placed on a reference plane 4 is imaged by the imaging device 1. As illustrated in a of the figure, the subject 401 has a shape raised in a direction from the reference plane 4 to the imaging device 1. An imaging lens 5 is disposed on the imaging device 1 in the figure. The imaging lens 5 can be placed at a focal position such that, for example, the reference plane 4 is in focus. The light emitted from a light source 2 is reflected from a surface of the subject 401 and enters the pixel array unit 10 (not illustrated) in the imaging device 1 via the imaging lens 5. The following describes a normal line with respect to a face 402 of the subject 401.

In the figure, b is a plan diagram of the subject 401 as seen from the direction of the imaging device 1. The coordinate axes (x-axis, y-axis, and z-axis) are defined as shown in b of the figure. The direction of a normal line 403 to the face 402 can be represented by an azimuth angle $\varphi$ which is an angle from the x-axis, and a zenith angle $\theta$, which is an angle from the z-axis. A three-dimensional shape of the subject 401 can be acquired by dividing the subject 401 into a plurality of faces and calculating the azimuth angle $\varphi$ and the zenith angle $\theta$ for each of the faces to obtain normal lines. The above-mentioned normal line information generating unit 503 generates the normal line information representing the azimuth angle $\varphi$ and the zenith angle $\theta$ for each of these faces.

[Polarization Information]

Figure 9A:
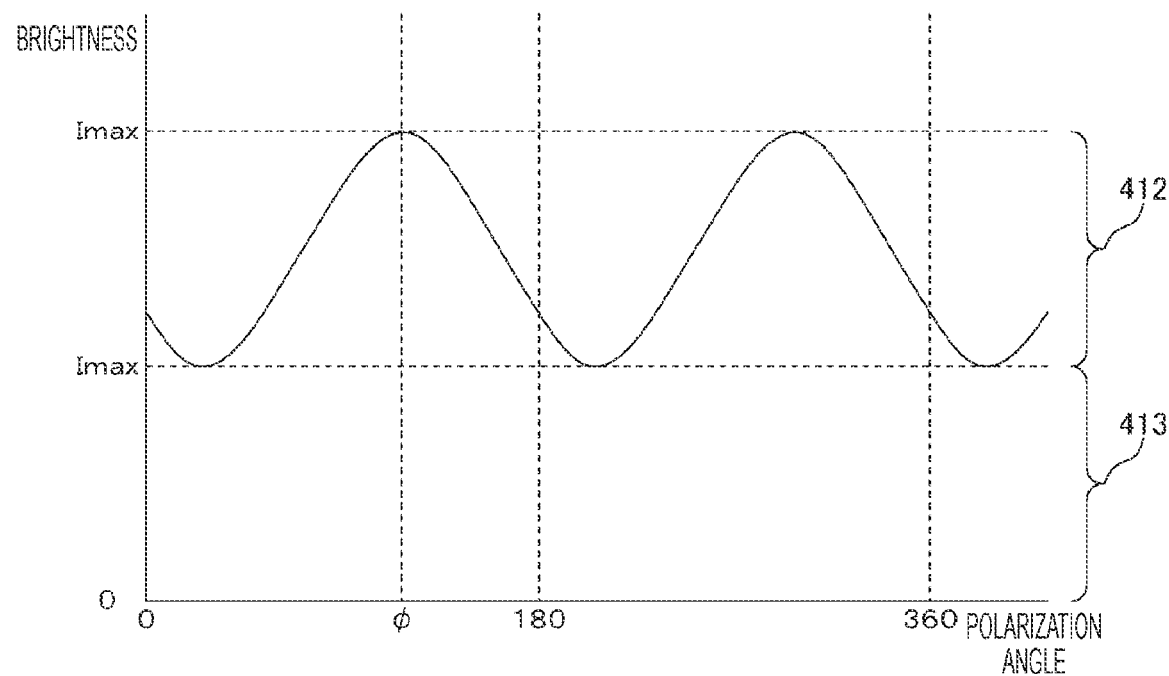
FIGS. 9A and 9B are diagrams illustrating an example of polarization information according to the first embodiment of the present disclosure.
Figure 9B:
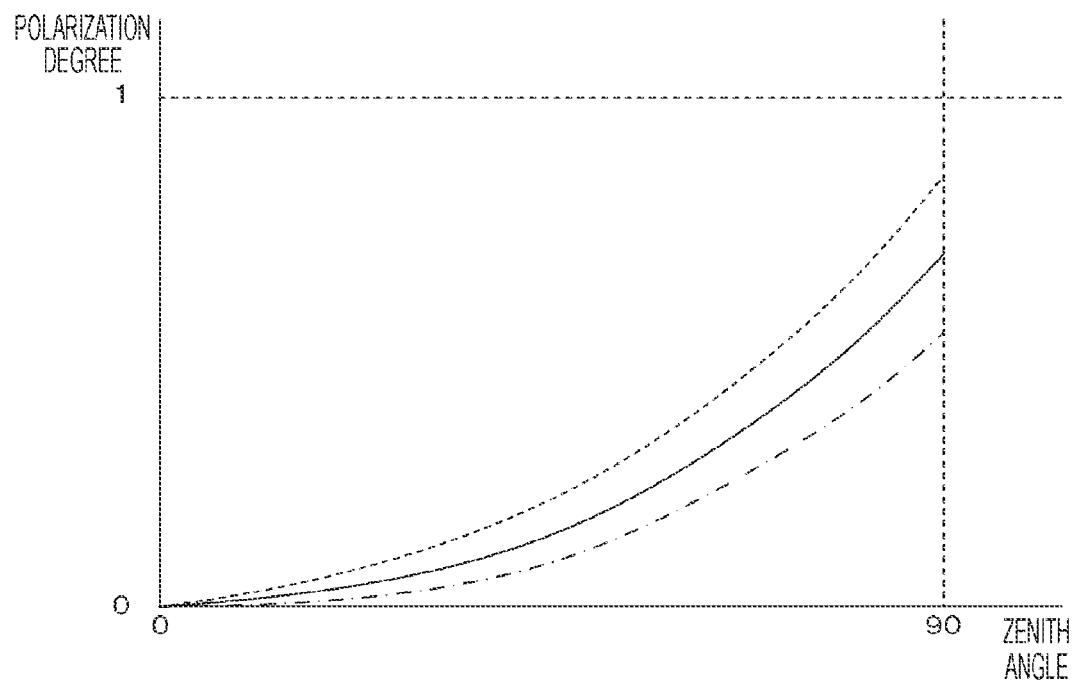

FIGS. 9A and 9B are diagrams illustrating an example of polarization information according to the first embodiment of the present disclosure. In the figure, a is a diagram illustrating a relationship between the polarization direction and the image signal level as of the time when the subject 401 described with reference to FIGS. 8A and 8B is imaged by the imaging device 1. The horizontal axis in a of the figure represents the polarization angle. The polarization angle corresponds to an angle from the x-axis toward the y-axis in FIGS. 8A and 8B. The vertical axis in a of the figure represents the brightness of an image. This brightness is a value corresponding to an image signal level. In the figure, a represents the change in brightness of an image on the assumption that the polarization direction of the polarizer 140 described with reference to FIGS. 2, 3A, and 3B is continuously changed. As shown in a of the figure, the light from the subject 401 includes the polarized component 412 that has the brightness varying with the polarization direction and the non-polarized component 413 that has the brightness being constant without regard to the polarization direction, the polarized component 412 being superposed on the non-polarized component 413. In a of the figure, Imax and Imin represent the maximum value and the minimum value of brightness, respectively. The polarized component 412 is represented by a sinusoidal wave with a period of 180 degrees in the graph.

The brightness I in a of the figure can be expressed by, for example, the following equation:

$$I = \frac{Imax + Imin}{2} + \frac{Imax - Imin}{2}\cos(2u - 2\phi) \quad (1)$$

where υ represents the polarization angle. The polarization information generating unit 502 generates the graph in a of the figure by extracting an image signal for each of the polarization directions of the polarizer 140 from image signals of the polarization pixels as obtained through separation by the image signal separating unit 501 and applying the extracted image signal to the equation (1). The normal line information generating unit 503 acquires Imax and Imin from the generated graph. In addition, the polarization angle at the brightness of Imax corresponds to the azimuth angle φ. The normal line information generating unit 503 can acquire the azimuth angle φ from Imax in the graph.

[Arrangement in Imaging Element]

FIG. 18 is a diagram illustrating an example arrangement of polarization pixels and phase difference pixels according to the third embodiment of the present disclosure. In the figure, a shows an example of the pixel array unit 10 that includes the polarization pixels 100 in which the polarizers 140 having three directions are arranged. The foregoing equation (1) has three variables: Imax, Imin, and azimuth angle φ. Therefore, polarization information can be generated by generating image signals with three polarization directions. A larger number of the phase difference pixels 200 can be arranged with fewer types of the polarization pixels 100. The accuracy of detecting a phase difference can be improved.

In addition, b in the figure shows an example of the pixel array unit 10 that includes the polarization pixels 100 in which the polarizers 140 having two directions are arranged, as well as including a pixel 300. The pixel 300 is a pixel where neither the polarizer 140 nor the light shielding film 241 is disposed. Furthermore, the polarizers 140 in the polarization pixels 100 have polarization directions that are not orthogonal to one another. Specifically, the polarizers have polarization directions of 0 degrees and 45 degrees. An image signal with a polarization direction of 90 degrees can be generated by subtracting an image signal of the polarization pixel 100 in which the polarizer 140 having a polarization direction of 0 degrees is disposed from an image signal generated by the pixel 300. Likewise, an image signal with a polarization direction of 135 degrees can be generated from image signals of the pixel 300 and the polarization pixel 100 in which the polarizer 140 having a polarization direction of 45 degrees is disposed. The image quality can be improved by disposing the pixel 300.

As shown in FIG. 9A, the brightness varies with the polarization direction with a periodicity of 180 degrees. Therefore, two directions that differ by 180 degrees are obtained by calculating the above-mentioned normal line, creating uncertainty. Specifically, it is unclear whether the subject 401 has a shape convex upward (closer to the imaging device 1) or convex downward (further from the imaging device 1) with respect to the reference plane 4.

[Phase Difference Information]

FIGS. 10A, 10B, 10C, 10D, 10E, and 10F are diagrams illustrating an example of phase difference information according to the first embodiment of the present disclosure. FIGS. 10A, 10B, and 10C are diagrams each illustrating a relationship among a subject 3, the imaging lens 5, and the pixel array unit 10 as of the time when a phase difference is detected. In addition, incident light 6a and incident light 6b in FIGS. 10A, 10B, and 10C represent, respectively, the incident light entering the phase difference pixel 200 having the opening 242 disposed on the right of the pixel and the incident light entering the phase difference pixel 200 having the opening 242 disposed on the left of the pixel.

FIG. 10A is a diagram illustrating the case of capturing an image of a face of the subject 3 located at the focal position of the imaging lens 5. In this case, the incident light 6a and the incident light 6b are condensed on the light receiving surface of the pixel array unit 10. FIG. 10B is a diagram illustrating the case of capturing an image of a face of the subject 3 located in front of the focal position of the imaging lens 5. The incident light 6a and the incident light 6b are condensed behind the pixel array unit 10, resulting in the so-called rear focus. Therefore, a shifted image is captured on the light receiving surface of the pixel array unit 10. FIG. 10C is a diagram illustrating the case of capturing an image of a face of the subject 3 located in the rear of the focal position of the imaging lens 5. The incident light 6a and the incident light 6b are condensed at a position closer to the imaging lens 5 away from the light receiving surface of the pixel array unit 10, resulting in the so-called front focus. An image shifted in a direction opposite to the direction in FIG. 10B is captured. In this way, the light condensing position varies with the position of the subject, and a shifted image may be captured.

Furthermore, FIGS. 10D, 10E, and 10F are diagrams that each represent an image obtained by imaging the subject 401 described with reference to FIGS. 8A and 8B and show a relationship between the phase difference pixel position and the brightness. In addition, FIGS. 10D, 10E, and 10F the cases where the subject is imaged in the positional relationships illustrated in FIGS. 10A, 10B, and 10C, respectively. Here, the phase difference pixel position refers to the position of each of a plurality of phase difference pixels 200 disposed on the same row in the pixel array unit 10. In addition, the solid line and the broken line in each of FIGS. 10D, 10E, and 10F represent the images based on the incident light 6a and the incident light 6b, respectively, the images being provided by the phase difference pixel 200 having the opening 242 disposed on the right of the pixel and the phase difference pixel 200 having the opening 242 disposed on the left of the pixel.

The phase difference information generating unit 504 described with reference to FIG. 7 generates, as the phase difference information, an image based on the image signal from the phase difference pixel 200. Furthermore, the depth information generating unit 505 detects the depth direction of the subject on the basis of the phase difference information, the depth direction being represented by the positional relationship (depth) of the subject with respect to the focal position, that is, the reference plane. With the depth information, the above-described problem of uncertainty can be solved. On the basis of the depth information and the normal line information, the normal vector generating unit 506 generates a normal vector including the orientation of the normal line to each of the faces of the subject 401. With the normal vector, it becomes possible to generate, for example, a depth map of the subject 401.

[Depth Map]

Figure 11:
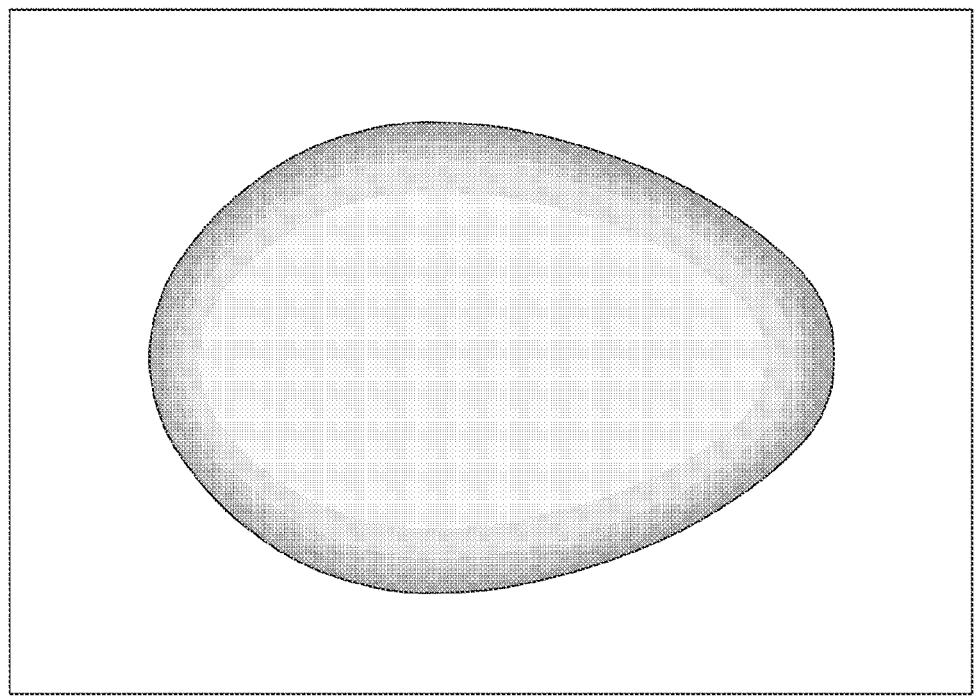
FIG. 11 is a diagram illustrating an example of a depth map according to the first embodiment of the present disclosure.

FIG. 11 is a diagram illustrating an example of a depth map according to the first embodiment of the present disclosure. The figure shows an example of a depth map generated from a normal vector. Depths of the subject are expressed by the gradation in the figure.

[Processing Method]

Figure 12:
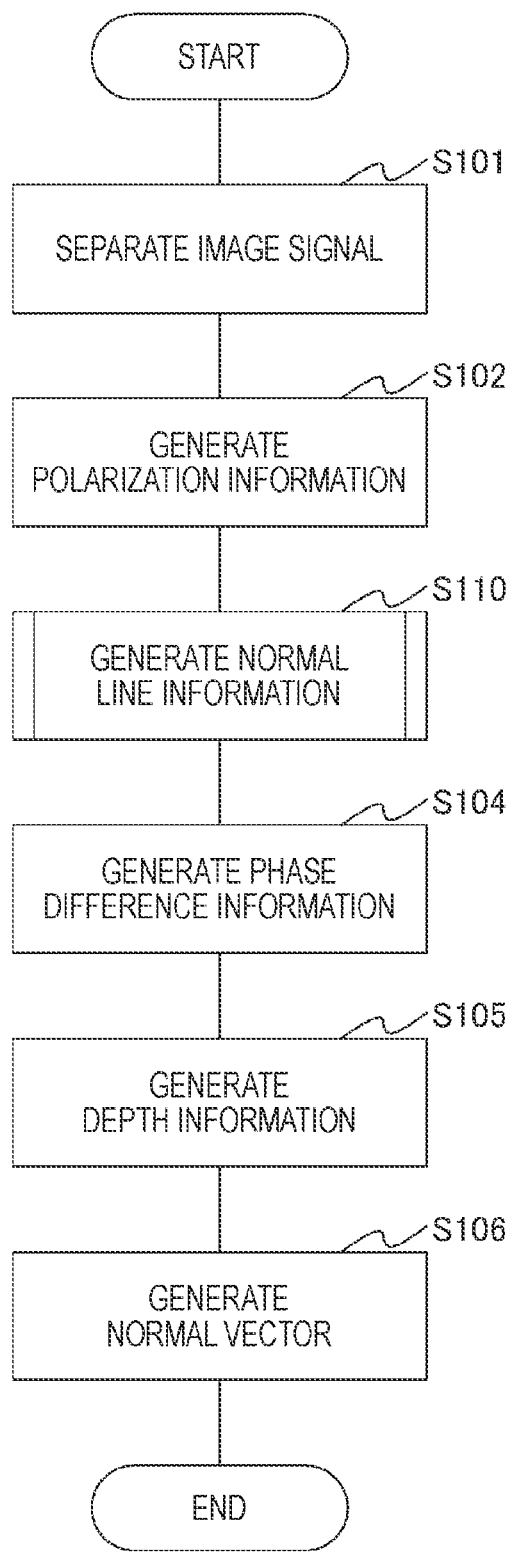
FIG. 12 is a diagram illustrating an example of a process in the processing unit according to the first embodiment of the present disclosure.

FIG. 12 is a diagram illustrating an example of a process in the processing unit according to the first embodiment of the present disclosure. First, the image signal separating unit 501 separates an image signal output from the column signal processing unit 30 into an image signal of the polarization pixel and an image signal of the phase difference pixel (step S101). Next, the polarization information generating unit 502 generates polarization information from image signals of the polarization pixels (step S102). Then, a normal line information generating process is executed to generate normal line information (step S110). Next, the phase difference information generating unit 504 generates phase difference information from image signals of the phase difference pixels (step S104). Then, the depth information generating unit 505 generates depth information on the basis of the phase difference information (step S105). Next, the normal vector generating unit 506 generates a normal vector from the normal line information and the depth information (step S106).

[Generating Normal Line Information]

Figure 13:
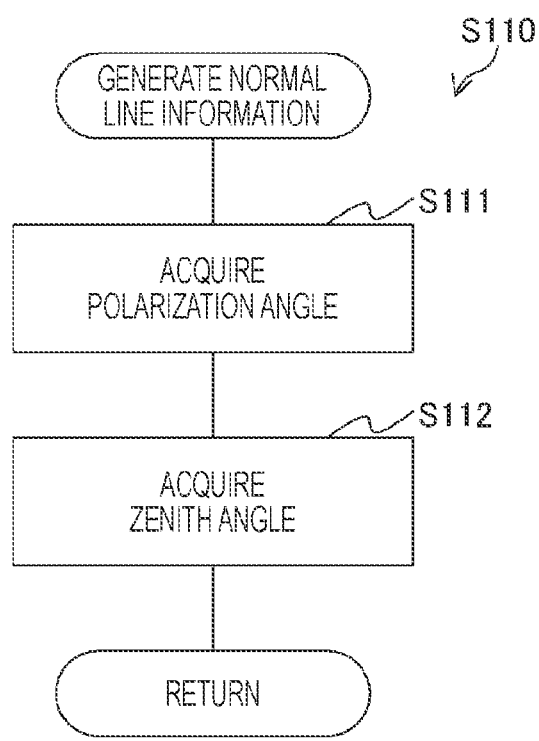
FIG. 13 is a diagram illustrating an example of a process of generating normal line information according to the first embodiment of the present disclosure.

FIG. 13 is a diagram illustrating an example of the process of generating normal line information according to the first embodiment of the present disclosure. The figure shows a process corresponding to the process of generating normal line information in FIG. 12. First, the normal line information generating unit 503 acquires a polarization angle φ from the polarization information (step S111). Next, the normal line information generating unit 503 acquires a zenith angle θ from the polarization information (step S112). After that, the normal line information generating unit 503 outputs, as the normal line information, the polarization angle φ and the zenith angle θ to the normal vector generating unit 506.

In this way, a normal vector can be generated on the basis of an image signal of the polarization pixel and an image signal of the phase difference pixel, the image signals being generated by the pixel array unit 10, whereby a three-dimensional shape of the subject 401 can be acquired.

As described above, in the imaging element (pixel array unit 10) according to the first embodiment of the present disclosure, the polarizer 140 and the light shielding film 241 can be formed simultaneously. Therefore, the process of manufacturing the pixel array unit 10 can be simplified.

2. Second Embodiment

The imaging device 1 of the first embodiment described above acquires a three-dimensional shape of the subject 401 from polarization information and phase difference information. On the other hand, the imaging device 1 of a second embodiment of the present disclosure is different from the imaging device of the first embodiment described above in that polarization information is used for improving the accuracy of phase difference detection.

[Configuration of Imaging Element]

Figure 14:
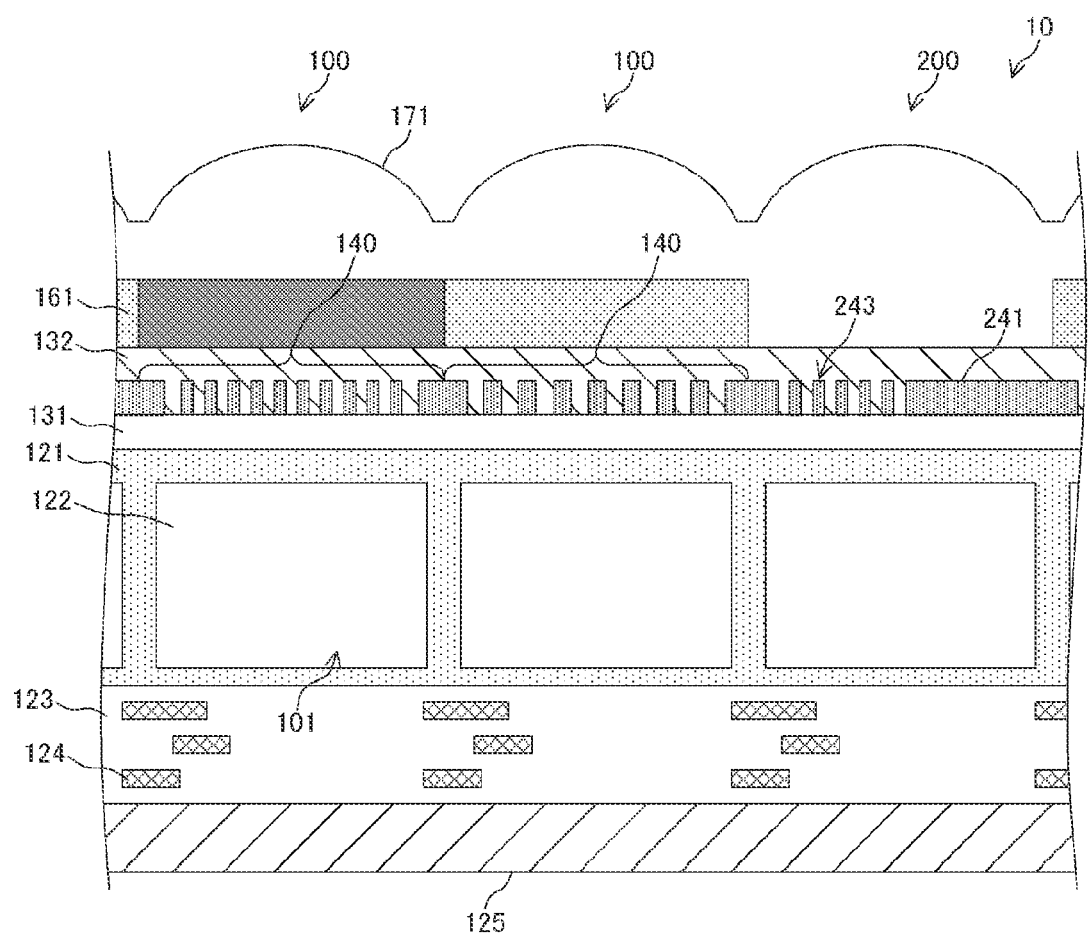
FIG. 14 is a diagram illustrating an example configuration of an imaging element according to a second embodiment of the present disclosure.

FIG. 14 is a diagram illustrating an example configuration of the imaging element according to the second embodiment of the present disclosure. The pixel array unit 10 in the figure is different from the pixel array unit 10 described with reference to FIG. 2 in that a polarizer is additionally disposed in the opening of the phase difference pixel 200.

The polarizer is disposed in an opening 243 in the figure. As a result, the phase difference pixel 200 in the figure allows phase difference information to be generated for each of the polarization directions.

[Arrangement in Imaging Element]

Figure 15:
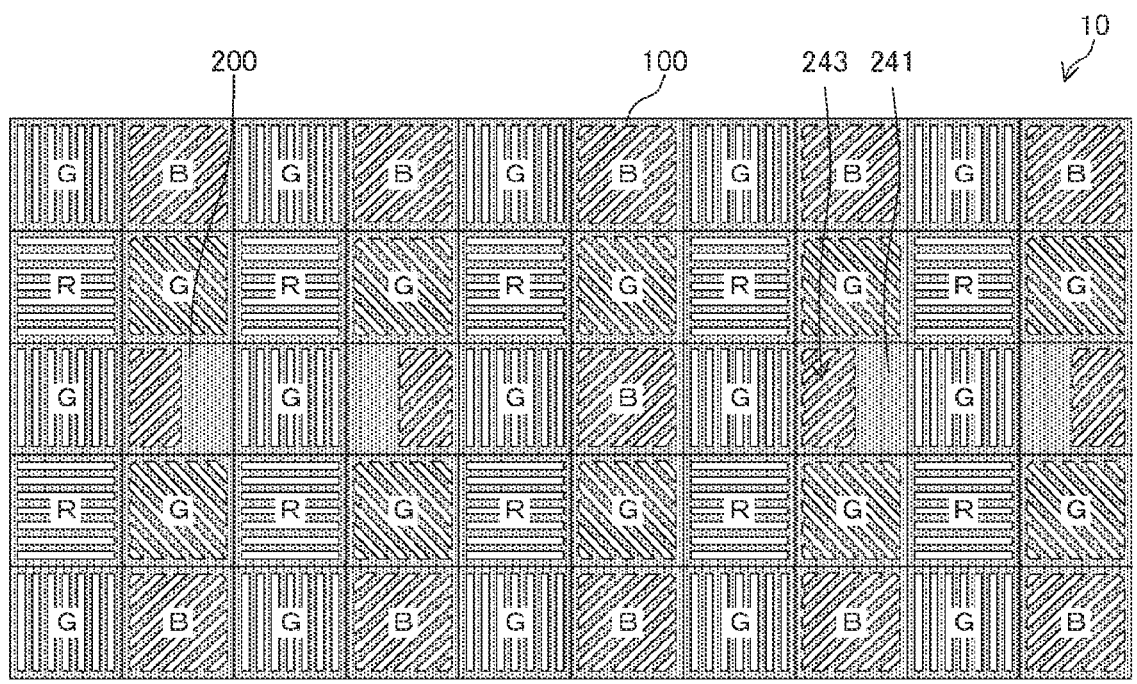
FIG. 15 is a diagram illustrating an example arrangement of polarization pixels and phase difference pixels according to the second embodiment of the present disclosure.

FIG. 15 is a diagram illustrating an example arrangement of polarization pixels and phase difference pixels according to the second embodiment of the present disclosure. As shown in the figure, the polarizer is additionally disposed in the opening 243 of the phase difference pixel 200.

By acquiring the phase difference information for each of the polarization directions, the focal length can be adjusted for a desired image. As described with reference to FIGS. 9A and 9B, the light from the subject includes a polarized component 412 and a non-polarized component 413. The polarized component 412 corresponds to a specular reflection component. An image signal representing, for example, the scenery or the like appearing on the windshield of a car is included in the polarized component 412. On the other hand, the non-polarized component 413 corresponds to diffuse reflection. An image signal representing, for example, a person or the like behind the windshield of a car is included in the non-polarized component 413. Therefore, by separating a polarized component and a non-polarized component from an image signal and detecting the phase difference of each component, the focal point can be adjusted to make the subject in focus for a desired image.

Furthermore, since the polarizer is disposed in the opening 243 of the phase difference pixel 200, the occurrence of color mixture caused by the incident light reflected from an end face of the light shielding film 241 can be reduced. Here, the color mixture refers to a phenomenon in which the light transmitted through the color filter on a pixel is mixed into the adjacent pixel to be imaged, and such a phenomenon may create a noise in an image signal.

[Configuration of Processing Unit]

Figure 16:
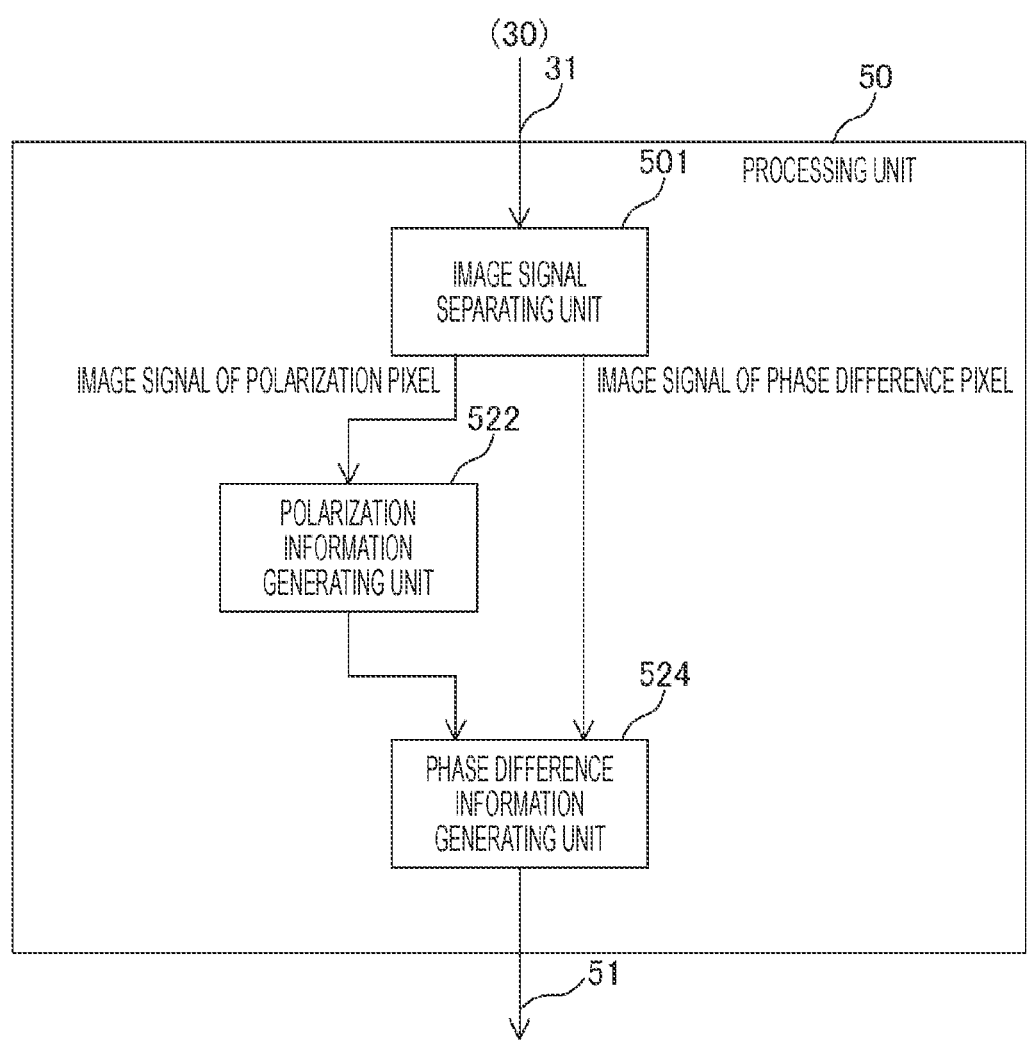
FIG. 16 is a diagram illustrating an example configuration of a processing unit according to the second embodiment of the present disclosure.

FIG. 16 is a diagram illustrating an example configuration of the processing unit according to the second embodiment of the present disclosure. The processing unit 50 in the figure is different from the processing unit 50 described with reference to FIG. 7 in that the normal line information generating unit 503, the depth information generating unit 505, and the normal vector generating unit 506 are omitted and a phase difference information generating unit 524 is included instead of the phase difference information generating unit 504. In addition, the processing unit 50 in the figure includes a polarization information generating unit 522 instead of the polarization information generating unit 502.

The polarization information generating unit 522 in the figure separates a non-polarized component and a polarized component from image signals of the polarization pixels and outputs the components to the phase difference information generating unit 524. The separation can be achieved by, for example, calculating an average value of image signals and subtracting the average value from image signals for each of the polarization directions to calculate a polarized component, and by subtracting the polarized component from image signals for each of the polarization directions to calculate a non-polarized component. Alternatively, a polarized component can be calculated by, for example, obtaining an image signal in a polarization direction closest to Imax in FIG. 9A. Note that the polarizer is additionally disposed in the phase difference pixel 200 as described with reference to FIG. 14, and therefore, a phase difference of the incident light polarized in a specific direction can be detected. For example, the scenery appearing on the windshield of a car can be in focus.

On the basis of the polarization information output by the polarization information generating unit 522, the phase difference information generating unit 524 in the figure selects a non-polarized component or a polarized component to generate phase difference information.

[Processing Method]

Figure 17:
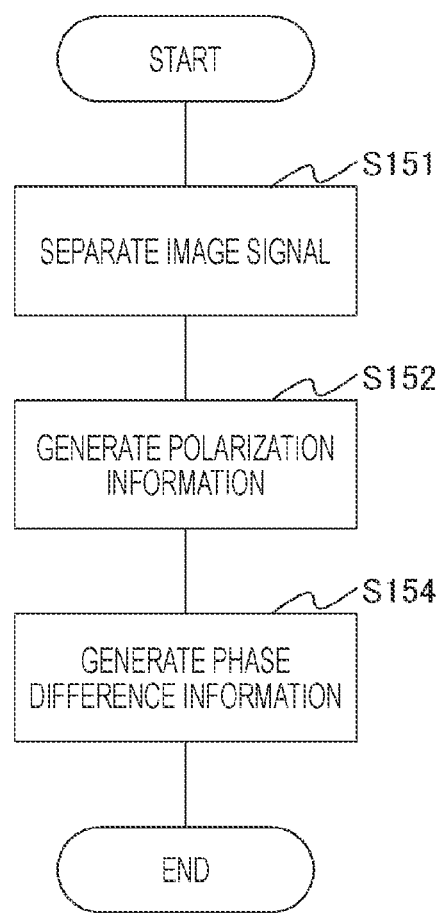
FIG. 17 is a diagram illustrating an example of a process in the processing unit according to the second embodiment of the present disclosure.

FIG. 17 is a diagram illustrating an example of a process in the processing unit according to the second embodiment of the present disclosure. First, the image signal separating unit 501 separates an image signal output from the column signal processing unit 30 into an image signal of the polarization pixel and an image signal of the phase difference pixel (step S151). Next, the polarization information generating unit 522 generates polarization information from image signals of the polarization pixels (step S152). Next, on the basis of the polarization information, the phase difference information generating unit 524 selects image signals of the phase difference pixels to generate phase difference information (step S154). By moving the imaging lens on the basis of the phase difference information, the focus of the lens can be adjusted for a desired image.

Note that the configuration of the imaging device 1 is not limited to this example. For example, the pixel array unit 10 described with reference to FIG. 2 may be used.

The configuration of the imaging device 1 except the foregoing is similar to the configuration of the imaging device 1 described in the first embodiment of the present disclosure, and thus the description thereof is omitted.

As described above, the imaging device 1 of the second embodiment of the present disclosure selects an image of the subject on the basis of polarization information and detects a phase difference. As a result, a phase difference can be detected in a desired image to adjust the focus of a lens.

3. Third Embodiment

In the pixel array unit 10 of the first embodiment described above, the polarizers 140 having four polarization directions are disposed. In contrast, the pixel array unit 10 of the third embodiment of the present disclosure is different from the above-described first embodiment in that polarizers 140 having three or less polarization directions are used.

[Arrangement in Imaging Element]

Figure 18A:
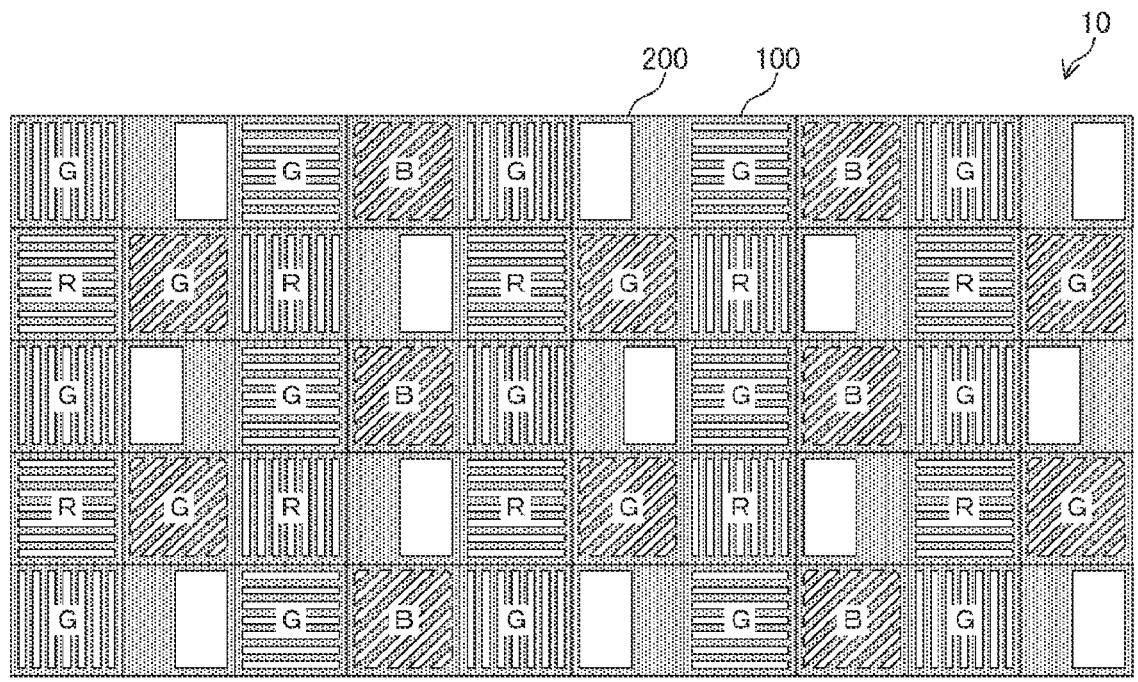
FIGS. 18A and 18B are diagrams illustrating an example arrangement of polarization pixels and phase difference pixels according to a third embodiment of the present disclosure.
Figure 18B:
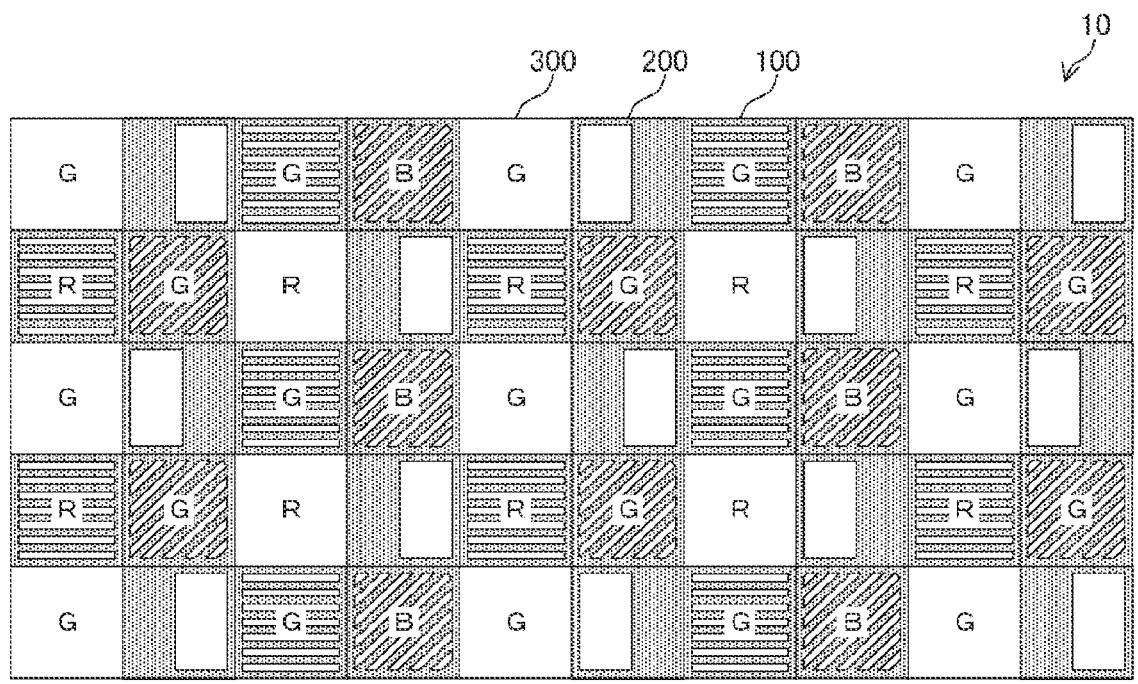

FIGS. 18A and 18B are diagrams illustrating an example arrangement of polarization pixels and phase difference pixels according to the third embodiment of the present disclosure. In the figure, a shows an example of the pixel array unit 10 that includes the polarization pixels 100 in which the polarizers 140 having three directions are arranged. The foregoing equation (1) has three variables: Imax, Imin, and azimuth angle φ. Therefore, polarization information can be generated by generating image signals with three polarization directions. A larger number of the phase difference pixels 200 can be arranged with fewer types of the polarization pixels 100. The accuracy of detecting a phase difference can be improved.

In addition, FIG. 18B shows an example of the pixel array unit 10 that includes the polarization pixels 100 in which the polarizers 140 having two directions are arranged, as well as including a pixel 300. The pixel 300 is a pixel where neither the polarizer 140 nor the light shielding film 241 is disposed. Furthermore, the polarizers 140 in the polarization pixels 100 have polarization directions that are not orthogonal to one another. Specifically, the polarizers have polarization directions of 0 degrees and 45 degrees. An image signal with a polarization direction of 90 degrees can be generated by subtracting an image signal of the polarization pixel 100 in which the polarizer 140 having a polarization direction of 0 degrees is disposed from an image signal generated by the pixel 300. Likewise, an image signal with a polarization direction of 135 degrees can be generated from image signals of the pixel 300 and the polarization pixel 100 in which the polarizer 140 having a polarization direction of 45 degrees is disposed. The image quality can be improved by disposing the pixel 300.

The configuration of the imaging device 1 except the foregoing is similar to the configuration of the imaging device 1 described in the first embodiment of the present disclosure, and thus the description thereof is omitted.

As described above, the imaging device 1 of the third embodiment of the present disclosure can have fewer types of the polarization pixels 100 disposed in the pixel array unit 10 and a larger number of the phase difference pixels 200. Furthermore, general pixels 300 can be disposed.

4. Fourth Embodiment

In the pixel array unit 10 of the first embodiment described above, the polarizer 140 and the light shielding film 241 are disposed in the same layer. In contrast, the pixel array unit 10 of the fourth embodiment of the present disclosure is different from the above-described first embodiment in that the polarizer 140 and the light shielding film 241 are disposed in different layers.

[Configuration of Imaging Element]

Figure 19:
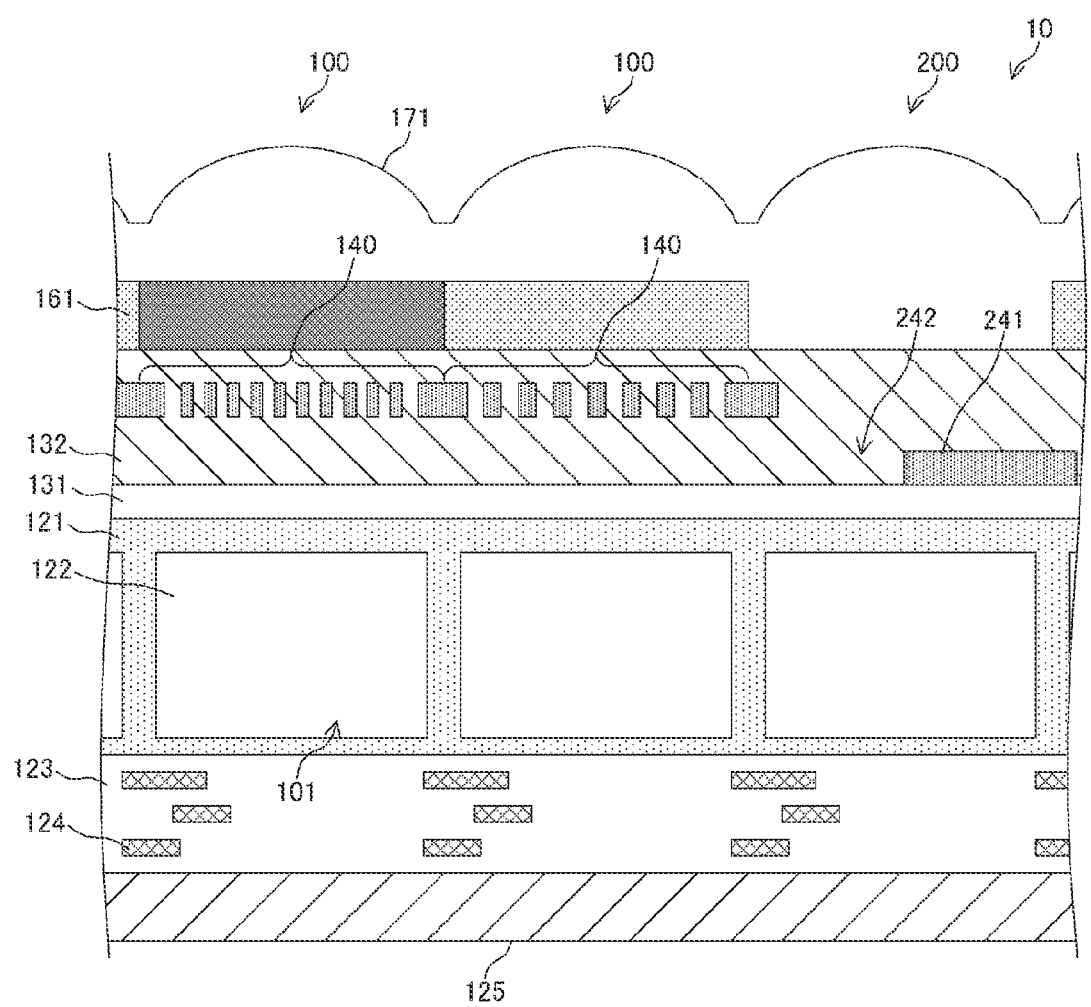
FIG. 19 is a diagram illustrating an example configuration of an imaging element according to a fourth embodiment of the present disclosure.

FIG. 19 is a diagram illustrating an example configuration of the imaging element according to the fourth embodiment of the present disclosure. The pixel array unit 10 in the figure is different from the pixel array unit 10 described with reference to FIG. 2 in that the polarizer 140 and the light shielding film 241 are disposed in different layers in the insulating film 132. The light shielding lines 141 of the polarizer 140 are arranged at a relatively narrow pitch. In contrast, the light shielding film 241 and the opening 242 are disposed at a wider pitch. In a case where the light shielding lines 141 and the light shielding film 241 are disposed in the same layer at such different pitches, it may be difficult to manufacture the pixel array unit 10 because etching conditions are different between the light shielding lines 141 and the light shielding film 241. In such cases, the light shielding lines 141 and the light shielding film 241 may be formed separately. In this case, the processing unit 50 can still perform the processes described with reference to FIGS. 12 and 17.

The configuration of the imaging device 1 except the foregoing is similar to the configuration of the imaging device 1 described in the first embodiment of the present disclosure, and thus the description thereof is omitted.

As described above, in the imaging device 1 of the fourth embodiment of the present disclosure, the polarizers 140 in the polarization pixel 100 and the phase difference pixel 200 in the pixel array unit 10 are disposed in a layer different from the layer in which the light shielding film 241 is disposed. Therefore, manufacturing of the polarizer 140 and the light shielding film 241 can be simplified.

5. Example of Application to Camera

The technology according to the present disclosure (the present technology) can be applied to various products. For example, the present technology may be implemented in the form of an imaging element provided in an imaging device such as a camera.

Figure 20:
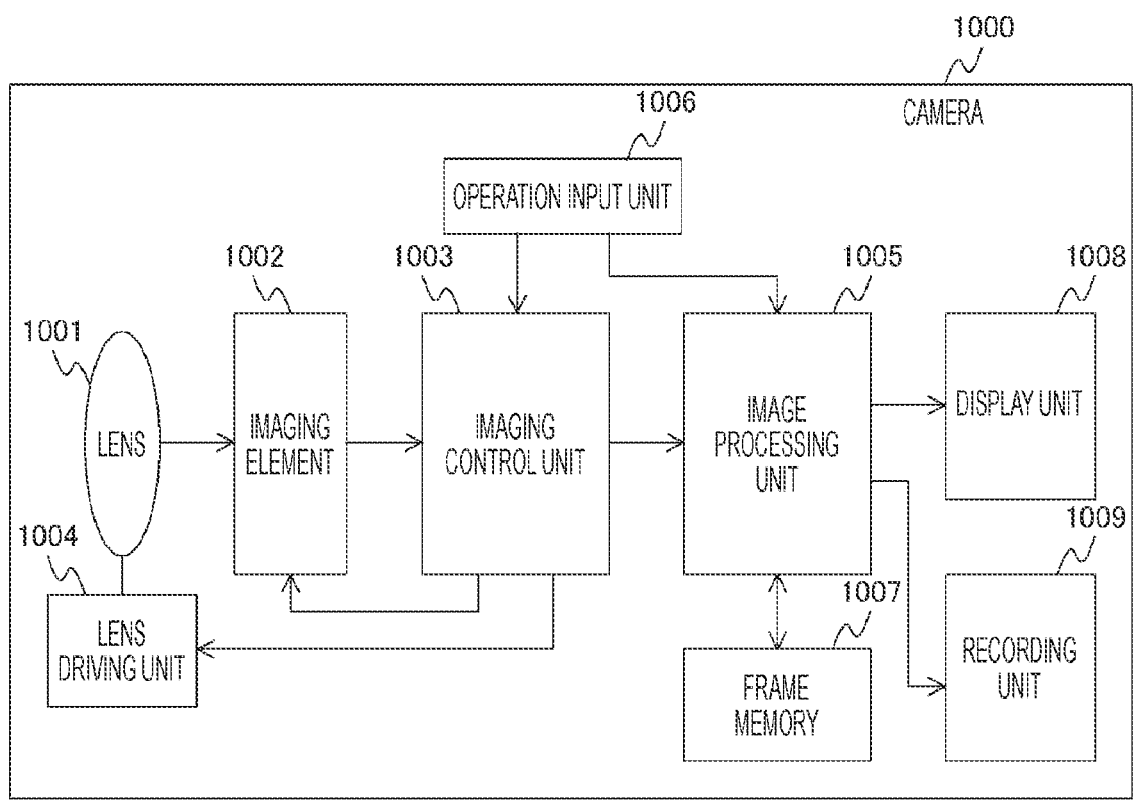
FIG. 20 is a block diagram schematically illustrating an example configuration of a camera, which is an example of the imaging device to which the present technology can be applied.

FIG. 20 is a block diagram schematically illustrating an example configuration of a camera, which is an example of the imaging device to which the present technology can be applied. A camera 1000 in the figure includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 condenses light from the subject so that the light enters the imaging element 1002 described below and an image of the subject is formed.

The imaging element 1002 is a semiconductor element that captures an image of the light that comes from the subject and is condensed by the lens 1001. The imaging element 1002 generates an analog image signal in accordance with the emitted light, converts the analog image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. Furthermore, the imaging control unit 1003 is capable of auto-focusing in the camera 1000 on the basis of an image signal output from the imaging element 1002. Here, the auto-focusing refers to a system for detecting the focal position of the lens 1001 and adjusting the focus automatically. As the auto-focusing, a method for detecting the focal position by detecting an imaging plane phase difference using the phase difference pixel disposed in the imaging element 1002 (imaging plane phase difference auto-focusing) can be used. In addition, a method for detecting, as the focal position, the position at which an image has the highest contrast (contrast auto-focusing) may be applied. The imaging control unit 1003 adjusts the position of the lens 1001 via the lens driving unit 1004 on the basis of the detected focal position to perform auto-focusing. Note that the imaging control unit 1003 may include, for example, a digital signal processor (DSP) containing firmware.

The lens driving unit 1004 drives the lens 1001 under the control of the imaging control unit 1003. The lens driving unit 1004 is capable of driving the lens 1001 by using a built-in motor to change the position of the lens 1001.

The image processing unit 1005 processes an image signal generated by the imaging element 1002. The processing includes, for example, demosaicing for generating an image signal of a missing color among image signals corresponding to red, green, and blue on a pixel-by-pixel basis, noise reduction for removing noise from an image signal, and encoding an image signal. The image processing unit 1005 may include, for example, a microcomputer containing firmware.

The operation input unit 1006 receives an operation input from a user of the camera 1000. For example, a push button or a touch panel can be used for the operation input unit 1006. An operation input received by the operation input unit 1006 is transmitted to the imaging control unit 1003 and the image processing unit 1005. Then, a process corresponding to the operation input, such as capturing an image of the subject, is started.

The frame memory 1007 is a memory that stores a frame, which represents image signals of one screen. The frame memory 1007 is controlled by the image processing unit 1005 to hold a frame when an image is being processed.

The display unit 1008 displays an image resulting from the processing by the image processing unit 1005. For example, a crystal panel can be used for the display unit 1008.

The recording unit 1009 records an image resulting from the processing by the image processing unit 1005. For example, a memory card or a hard disk can be used for the recording unit 1009.

The foregoing has described a camera to which the present invention can be applied. The present technology may be applied to the imaging element 1002 among the above-described components. Specifically, the imaging device 1 described with reference to FIG. 1 can be applied to the imaging element 1002. Auto-focusing can be performed on the basis of the phase difference information generated by the imaging device 1.

Note that, although the camera has been described as an example herein, the technology according to the present invention may be applied to others, such as, for example, a monitoring device.

Finally, the description of each of the embodiments described above is an example of the present disclosure, and the present disclosure is not limited to the above-described embodiments. Therefore, it goes without saying that various changes can be made depending on the design and the like without departing from the technical concept according to the present disclosure even in others than the above-described embodiments.

Furthermore, the processing procedure described in the above-described embodiments may be regarded as a method including the series of procedures, or regarded as a program for causing a computer to execute the series of procedures or as a recording medium storing the program. Examples of the recording medium that can be used include a compact disc (CD), a digital versatile disc (DVD), and a memory card.

Note that the present technology may have the following configurations.

(1) An imaging element including:

a polarization pixel that includes a polarizer transmitting incident light having a specific polarization direction and generates an image signal based on the incident light being from a subject and being transmitted through the polarizer; and a phase difference pixel that includes a light shielding film being formed simultaneously with the polarizer and being disposed to be shifted in a predetermined pupil-division direction for pupil-dividing the incident light from the subject and generates an image signal for detecting a phase difference.

(2) The imaging element according to (1), in which the polarizer includes a wire grid that includes a plurality of strip-shaped conductors arranged at a predetermined pitch.

(3) The imaging element according to (1) or (2), in which the light shielding film includes the same material as the material of the polarizer.

(4) The imaging element according to any one of (1) to (3), in which the phase difference pixel further includes the polarizer.

(5) The imaging element according to any one of (1) to (4), in which the polarization pixel individually includes the polarizer having at least three polarization directions.

(6) The imaging element according to (1), further including: a pixel that generates an image signal based on the incident light from the subject.

(7) The imaging element according to (6), in which the polarization pixel individually includes the polarizer having at least two polarization directions.

(8) An imaging device including:

a polarization pixel, which is a pixel that includes a polarizer transmitting incident light that has a specific polarization direction, the incident light being from a subject;

a phase difference pixel, which is a pixel that includes a light shielding film being formed simultaneously with the polarizer and being disposed to be shifted in a predetermined pupil-division direction for pupil-dividing the incident light; and a processing unit that processes an image signal generated by the polarization pixel and an imaging signal generated by the phase difference pixel.

(9) The imaging device according to (8), in which the processing unit includes:

a polarization information generating unit that generates polarization information on the basis of an image signal generated by the polarization pixel, the polarization information being information regarding polarization in an image of the subject; and a phase difference information generating unit that generates, on the basis of an image signal generated by the phase difference pixel, phase difference information representing a phase difference in the subject.

(10) The imaging device according to (9), in which the processing unit includes:

a normal line information generating unit that generates normal line information regarding an image of the subject, on the basis of the polarization information that has been generated; and a depth information generating unit that generates depth information regarding an image of the subject, on the basis of the phase difference information that has been generated.

(11) The imaging device according to (10), in which the processing unit further includes a normal vector generating unit that generates a normal vector in an image of the subject, on the basis of the normal line information that has been generated and the depth information that has been generated.

(12) The imaging device according to (9), in which the phase difference information generating unit generates the phase difference information regarding an image selected on the basis of the polarization information that has been generated.

(13) An imaging method including:

a polarization information generating step of generating, on the basis of an image signal generated by a polarization pixel that includes a polarizer transmitting incident light having a specific polarization direction and generates the image signal based on the incident light being from a subject and being transmitted through the polarizer, polarization information being information regarding polarization in an image of the subject; and a phase difference information generating step of generating, on the basis of an image signal generated by a phase difference pixel that includes a light shielding film being formed simultaneously with the polarizer and being disposed to be shifted in a predetermined pupil-division direction for pupil-dividing the incident light from the subject, phase difference information representing a phase difference in the subject.

REFERENCE SIGNS LIST

1 Imaging device
10 Pixel array unit
50 Processing unit
100 Polarization pixel
131 Insulating film
132 Insulating film
140 Polarizer
141 Light shielding line
142 Gap
200 Phase difference pixel
241 Light shielding film
242 Opening
300 Pixel
403 Normal line
412 Polarized component
413 Non-polarized component
501 Image signal separating unit
502 Polarization information generating unit
503 Normal line information generating unit
504 Phase difference information generating unit
505 Depth information generating unit
506 Normal vector generating unit
522 Polarization information generating unit
524 Phase difference information generating unit
1000 Camera
1002 Imaging element

The invention claimed is:

1. An imaging element, comprising:
a polarization pixel that includes a polarizer transmitting incident light having a specific polarization direction and generates a first image signal based on the incident light being from a subject and being transmitted through the polarizer; and
a phase difference pixel that includes a light shielding film being formed simultaneously with the polarizer and being disposed to be shifted in a predetermined pupil-division direction for pupil-dividing the incident light from the subject and generates a second image signal for detecting a phase difference.

2. The imaging element according to claim 1, wherein the polarizer includes a wire grid that includes a plurality of strip-shaped conductors arranged at a predetermined pitch.

3. The imaging element according to claim 1, wherein the light shielding film includes a same material as a material of the polarizer.

4. The imaging element according to claim 1, wherein the phase difference pixel further includes the polarizer.

5. The imaging element according to claim 1, wherein the polarization pixel individually includes the polarizer having at least three polarization directions.

6. The imaging element according to claim 1, further comprising a pixel that generates the first image signal based on the incident light from the subject.

7. The imaging element according to claim 6, wherein the polarization pixel individually includes the polarizer having at least two polarization directions.

8. An imaging device, comprising:
a polarization pixel, which is a pixel that includes a polarizer transmitting incident light that has a specific polarization direction, the incident light being from a subject;
a phase difference pixel, which is a pixel that includes a light shielding film being formed simultaneously with the polarizer and being disposed to be shifted in a predetermined pupil-division direction for pupil-dividing the incident light; and
a processing unit that processes a first image signal generated by the polarization pixel and a second image signal generated by the phase difference pixel.

9. The imaging device according to claim 8, wherein the processing unit includes:
a polarization information generating unit that generates polarization information on a basis of the first image signal generated by the polarization pixel, the polarization information being information regarding polarization in an image of the subject; and a phase difference information generating unit that generates, on a basis of the second image signal generated by the phase difference pixel, phase difference information representing a phase difference in the subject.

10. The imaging device according to claim 9, wherein the processing unit includes:

a normal line information generating unit that generates normal line information regarding the image of the subject, on a basis of the polarization information that has been generated; and a depth information generating unit that generates depth information regarding the image of the subject, on a basis of the phase difference information that has been generated.

11. The imaging device according to claim 10, wherein the processing unit further includes a normal vector generating unit that generates a normal vector in the image of the subject, on a basis of the normal line information that has been generated and the depth information that has been generated.

12. The imaging device according to claim 9, wherein the phase difference information generating unit generates the phase difference information regarding the image selected on a basis of the polarization information that has been generated.

13. An imaging method, comprising:

a polarization information generating step of generating, on a basis of a first image signal generated by a polarization pixel that includes a polarizer transmitting incident light having a specific polarization direction and generates the first image signal based on the incident light being from a subject and being transmitted through the polarizer, polarization information being information regarding polarization in an image of the subject; and a phase difference information generating step of generating, on a basis of a second image signal generated by a phase difference pixel that includes a light shielding film being formed simultaneously with the polarizer and being disposed to be shifted in a predetermined pupil-division direction for pupil-dividing the incident light from the subject, phase difference information representing a phase difference in the subject.

* * * * *